(12) United States Patent
Huang et al.

(10) Patent No.: US 11,652,124 B2
(45) Date of Patent: May 16, 2023

(54) ISOLATION STRUCTURE HAVING AN AIR GAP TO REDUCE PIXEL CROSSTALK

(71) Applicant: Taiwan Semiconductor Manufacturing Company Limited, Hsinchu (TW)

(72) Inventors: Tsung-Wei Huang, Taichung (TW); Chao-Ching Chang, Kaohsiung (TW); Yun-Wei Cheng, Taipei (TW); Chih-Lung Cheng, Tainan (TW); Yen-Chang Chen, Tainan (TW); Wen-Jen Tsai, Kaohsiung (TW); Cheng Han Lin, Tainan (TW); Yu-Hsun Chih, Kaohsiung (TW); Sheng-Chan Li, Tainan (TW); Sheng-Chau Chen, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 85 days.

(21) Appl. No.: 16/949,116

(22) Filed: Oct. 14, 2020

(65) Prior Publication Data
US 2022/0115421 A1    Apr. 14, 2022

(51) Int. Cl.
*H01L 31/0232* (2014.01)
*H01L 27/146* (2006.01)

(52) U.S. Cl.
CPC .... *H01L 27/1463* (2013.01); *H01L 27/14621* (2013.01); *H01L 27/14627* (2013.01); *H01L 27/14645* (2013.01); *H01L 27/14685* (2013.01); *H01L 27/14689* (2013.01)

(58) Field of Classification Search
None
See application file for complete search history.

(56) References Cited

U.S. PATENT DOCUMENTS

| 10,032,819 B2* | 7/2018 | Lee | H01L 27/1463 |
|---|---|---|---|
| 11,152,520 B1* | 10/2021 | Adusumilli | H01L 27/1446 |
| 2013/0285181 A1* | 10/2013 | Lin | H01L 27/1463 |
| | | | 257/E31.127 |
| 2015/0279885 A1* | 10/2015 | Tu | H01L 27/14689 |
| | | | 438/70 |
| 2020/0006410 A1* | 1/2020 | Wu | H01L 27/14685 |

* cited by examiner

*Primary Examiner* — Ali Naraghi
(74) *Attorney, Agent, or Firm* — Harrity & Harrity, LLP

(57) ABSTRACT

An isolation structure can be formed between adjacent and/or non-adjacent pixel regions (e.g., between diagonal or cross-road pixel regions), of an image sensor, to reduce and/or prevent optical crosstalk. The isolation structure may include a deep trench isolation (DTI) structure or another type of trench that is partially filled with a material such that an air gap is formed therein. The DTI structure having the air gap formed therein may reduce optical crosstalk between pixel regions. The reduced optical crosstalk may increase spatial resolution of the image sensor, may increase overall sensitivity of the image sensor, may decrease color mixing between pixel regions of the image sensor, and/or may decrease image noise after color correction of images captured using the image sensor.

20 Claims, 22 Drawing Sheets

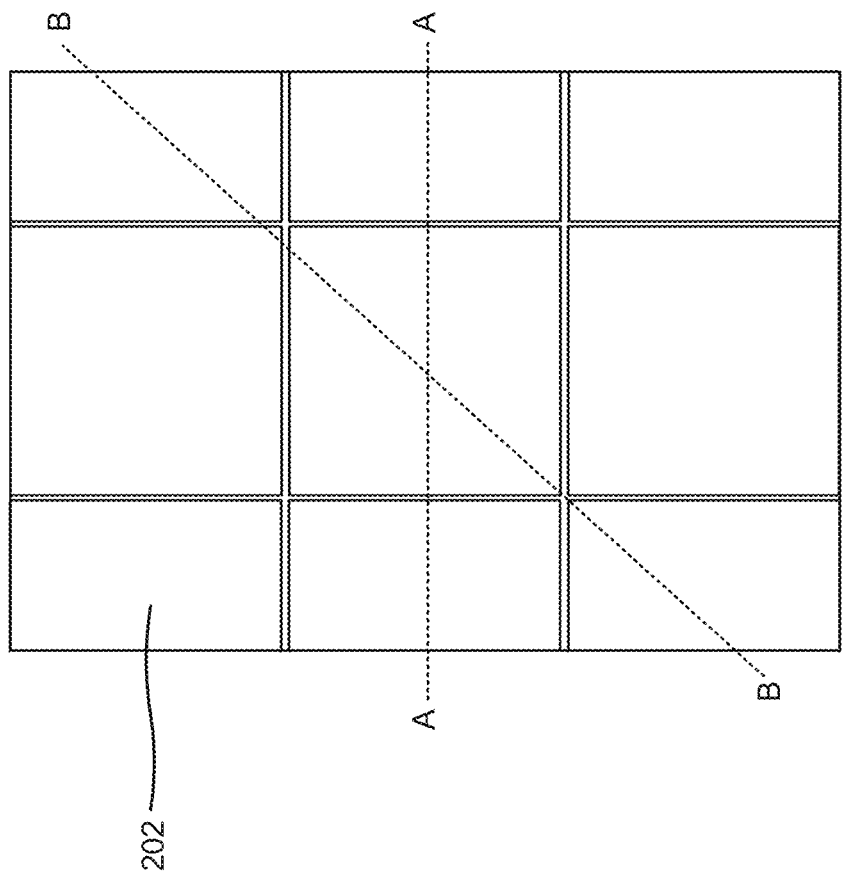

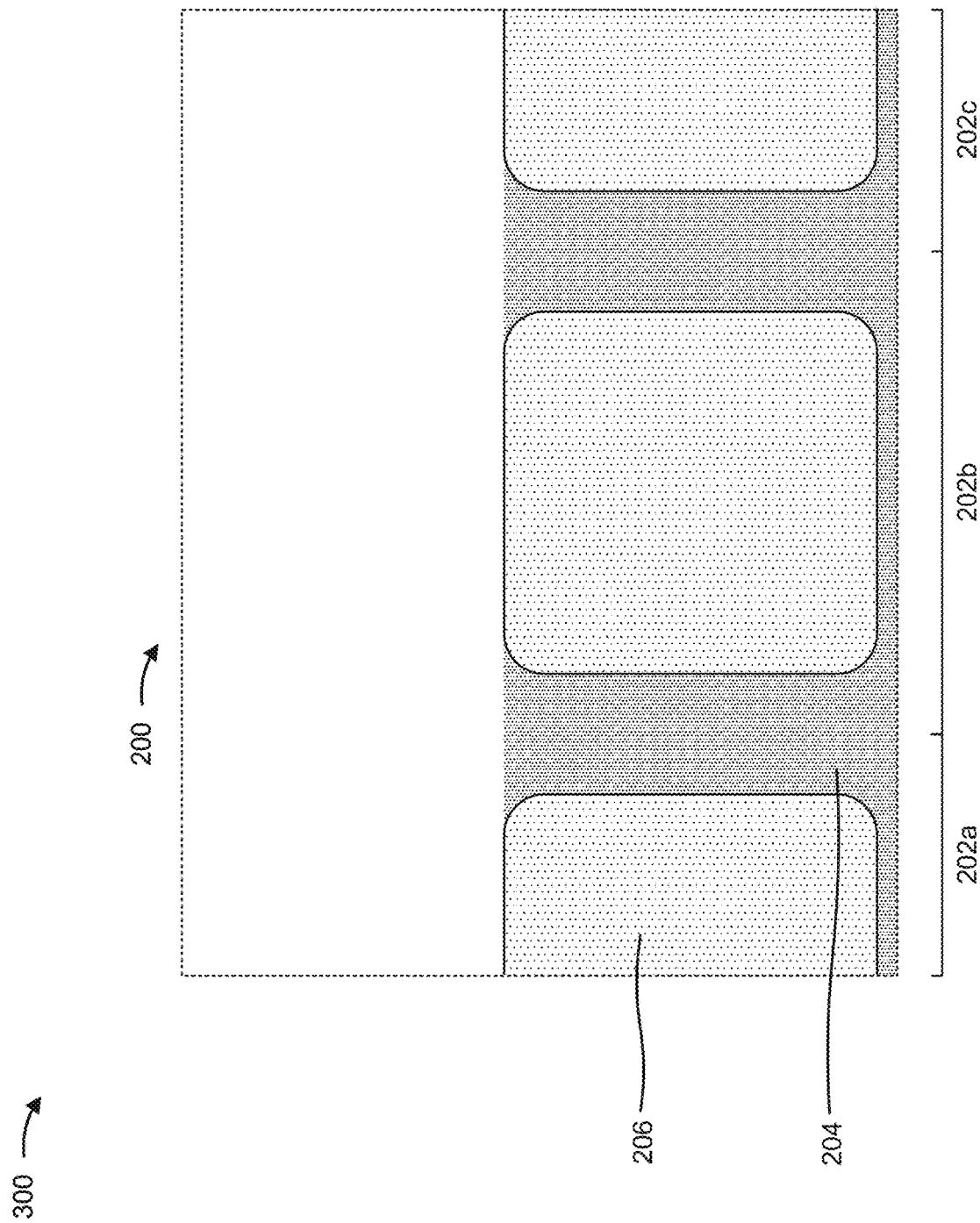

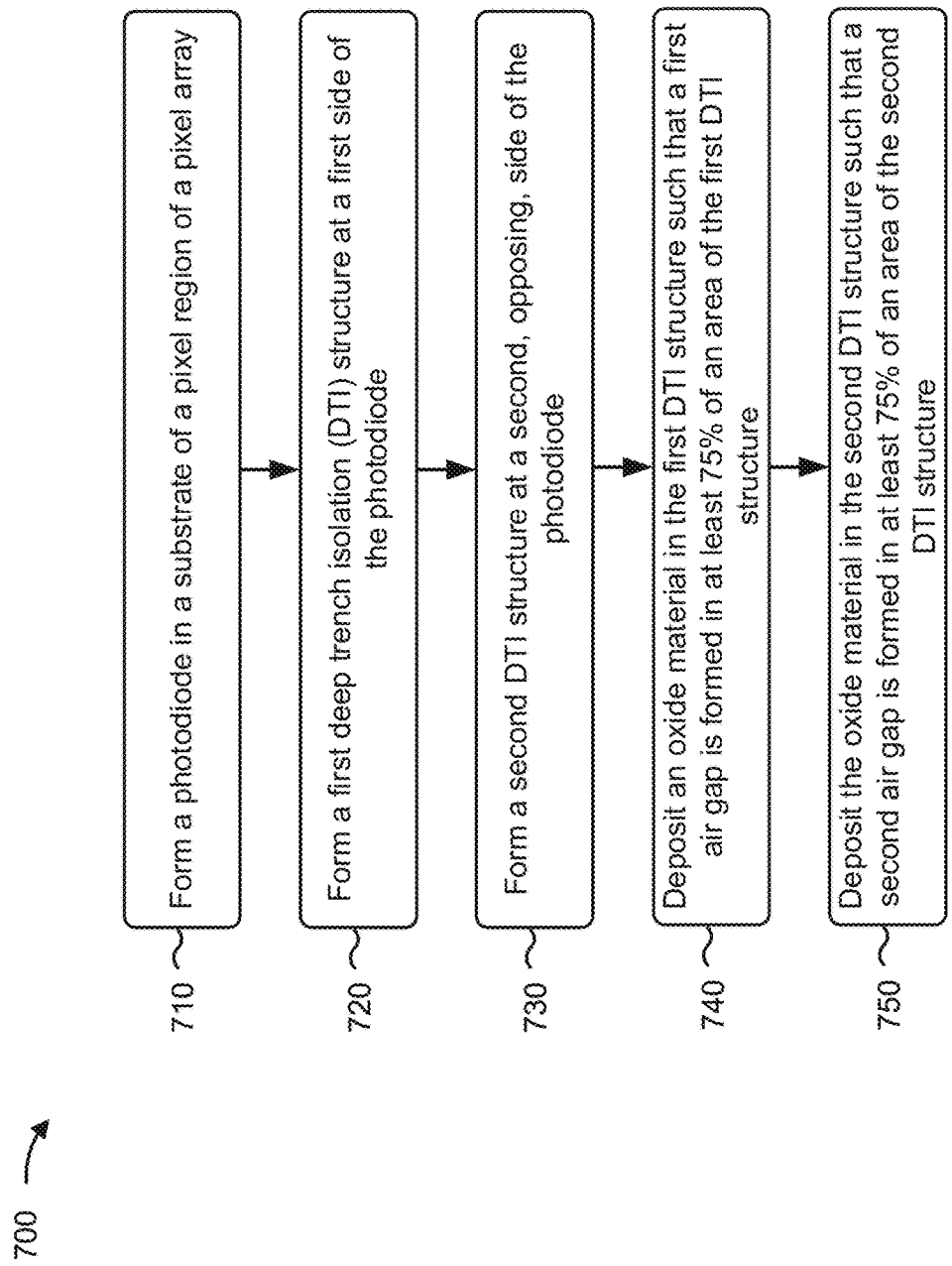

ISOLATION STRUCTURE HAVING AN AIR GAP TO REDUCE PIXEL CROSSTALK

BACKGROUND

Digital cameras and other optical imaging devices employ image sensors. Image sensors convert optical images to digital data that may be represented as digital images. An image sensor, such as a complementary metal oxide semiconductor (CMOS) image sensor, includes an array of pixel regions and supporting logic. The pixel regions of the array are semiconductor devices for measuring incident light (i.e., light that is directed toward the pixel regions), and the supporting logic facilitates readout of the measurements. One type of image sensor commonly used in optical imaging devices is a back side illumination (BSI) CMOS image sensor. BSI CMOS image sensor fabrication can be integrated into semiconductor processes for low cost, small size, and high integration. Further, BSI CMOS image sensors have low operating voltage, low power consumption, high quantum efficiency, and low read-out noise, and allow random access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2D are diagrams of an example pixel array described herein.

FIGS. 3A-3J are diagrams of an example of forming the pixel array of FIGS. 2A-2D described herein.

FIG. 7 is a flowchart of an example process relating to forming a portion of a pixel array.

DETAILED DESCRIPTION

Figure 1:
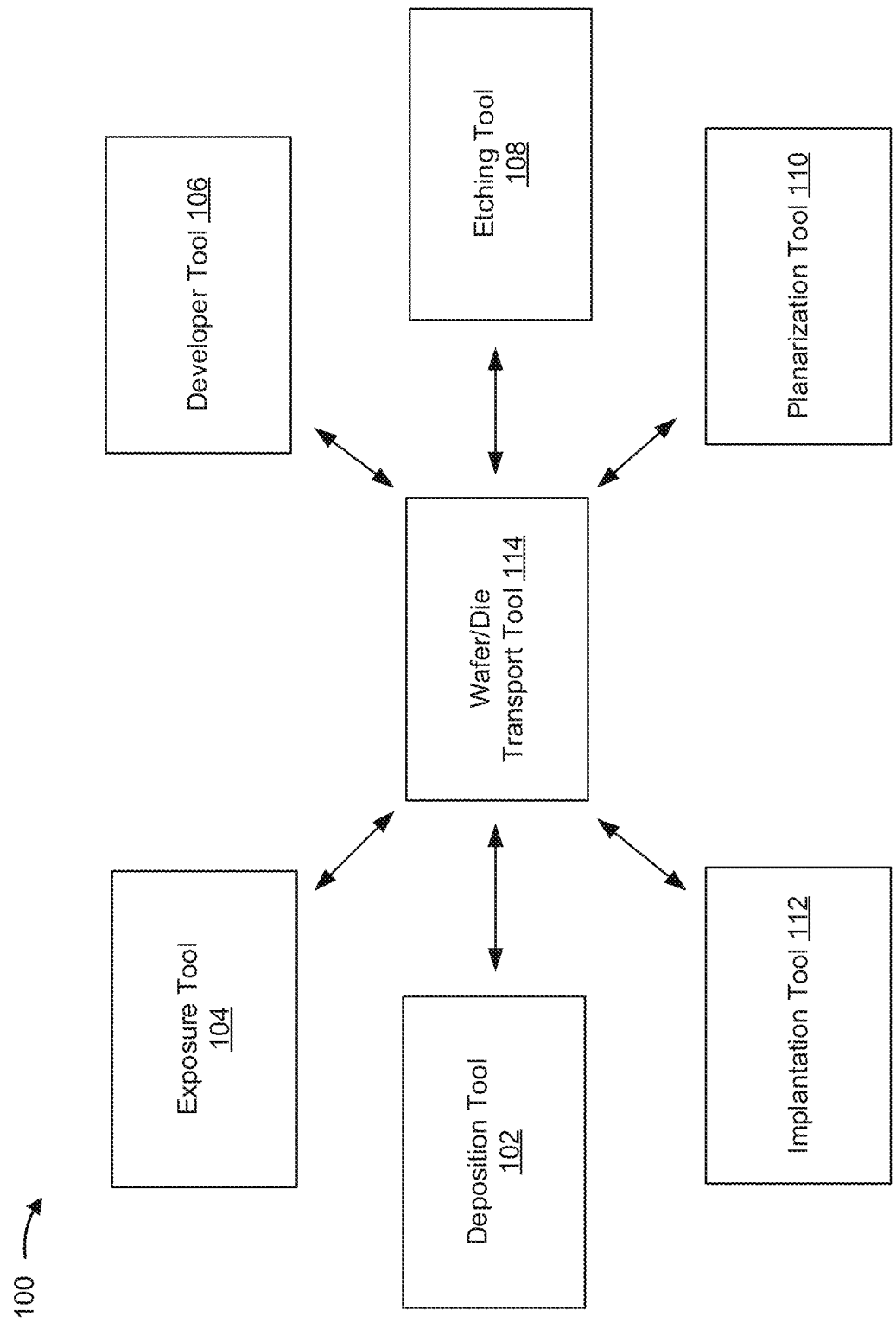
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Optical crosstalk can occur between adjacent pixel regions in a pixel array (e.g., a back side illumination (BSI) complementary metal oxide semiconductor (CMOS) image sensor and/or another type of CMOS image sensor). Optical crosstalk is a phenomena whereby incident light passes through a pixel region at a non-orthogonal angle and is at least partially absorbed by a photodiode of an adjacent pixel region. Optical crosstalk in a pixel array of a CMOS image sensor can degrade the spatial resolution of the CMOS image sensor, can reduce overall sensitivity of the CMOS image sensor, can cause color mixing between pixel regions of the CMOS image sensor, and/or can lead to image noise after color correction.

Some implementations described herein provide an isolation structure that can be formed between adjacent and/or non-adjacent pixel regions (e.g., between diagonal or cross-road pixel regions), of an image sensor, to reduce and/or prevent optical crosstalk. The isolation structure may include a deep trench isolation (DTI) structure or another type of trench that is partially filled with a material such that an air gap is formed therein. Air has the lowest refractive index of all materials and is the closest to the refractive index of a vacuum. The low refractive index of air relative to the refractive index of the material in the DTI structure (which may include an oxide or another type of material) lowers the critical angle for a total internal reflection at the boundary between the material and the air gap in the DTI structure. Incident light traveling toward the boundary between the material and the air gap at an angle that is equal to or greater than the critical angle will likely be totally reflected off of the material-air gap boundary. Thus, the lower critical angle increases the likelihood that a total internal reflection of incident light will occur in the DTI stricture, which will cause the incident light to reflect off of the material-air gap boundary and be absorbed by an associated pixel region as opposed (or in addition) to the incident light traveling through the DTI structure and being absorbed by an adjacent (or non-adjacent) pixel region. Accordingly, the DTI structure having the air gap formed therein may reduce optical crosstalk between pixel regions. The reduced optical crosstalk may increase spatial resolution of the image sensor, may increase overall sensitivity of the image sensor, may decrease color mixing between pixel regions of the image sensor, and/or may decrease image noise after color correction of images captured using the image sensor.

FIG. 1 is a diagram of an example environment 100 in which systems and/or methods described herein may be implemented. As shown in FIG. 1, environment 100 may include a plurality of semiconductor processing tools 102-112 and a wafer/die transport tool 114. The plurality of semiconductor processing tools 102-112 may include a deposition tool 102, an exposure tool 104, a developer tool 106, an etching tool 108, a planarization tool 110, an implantation tool 112, and/or another type of semiconductor processing tool. The tools included in example environment 100 may be included in a semiconductor clean room, a semiconductor foundry, a semiconductor processing and/or manufacturing facility, and/or the like.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light source, and/or the like), an x-ray source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The etch tool 108 is a semiconductor processing tool that is capable of etching various types of materials of a substrate, wafer, or semiconductor device. For example, the etching tool 108 may include a wet etch tool, a dry etch tool, and/or the like. In some implementations, the etching tool 108 includes a chamber that is filled with an etchant, and the substrate is placed in the chamber for a particular time period to remove particular amounts of one or more portions of the substrate. In some implementations, the etching tool 108 may etch one or more portions of the substrate using a plasma etch or a plasma-assisted etch, which may involve using an ionized gas to isotopically or directionally etch the one or more portions.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The planarization tool 110 is a semiconductor processing tool that is capable of polishing or planarizing various layers of a wafer or semiconductor device. For example, a polishing device may include a chemical mechanical polishing (CMP) device and/or another type of polishing device. In some implementations, a polishing device may polish or planarize a layer of deposited or plated material.

Wafer/die transport tool 114 includes a mobile robot, a robot arm, a tram or rail car, and/or another type of device that are used to transport wafers and/or dies between semiconductor processing tools 102-112 and/or to and from other locations such as a wafer rack, a storage room, and/or the like. In some implementations, wafer/die transport tool 114 may be a programmed device to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2B:
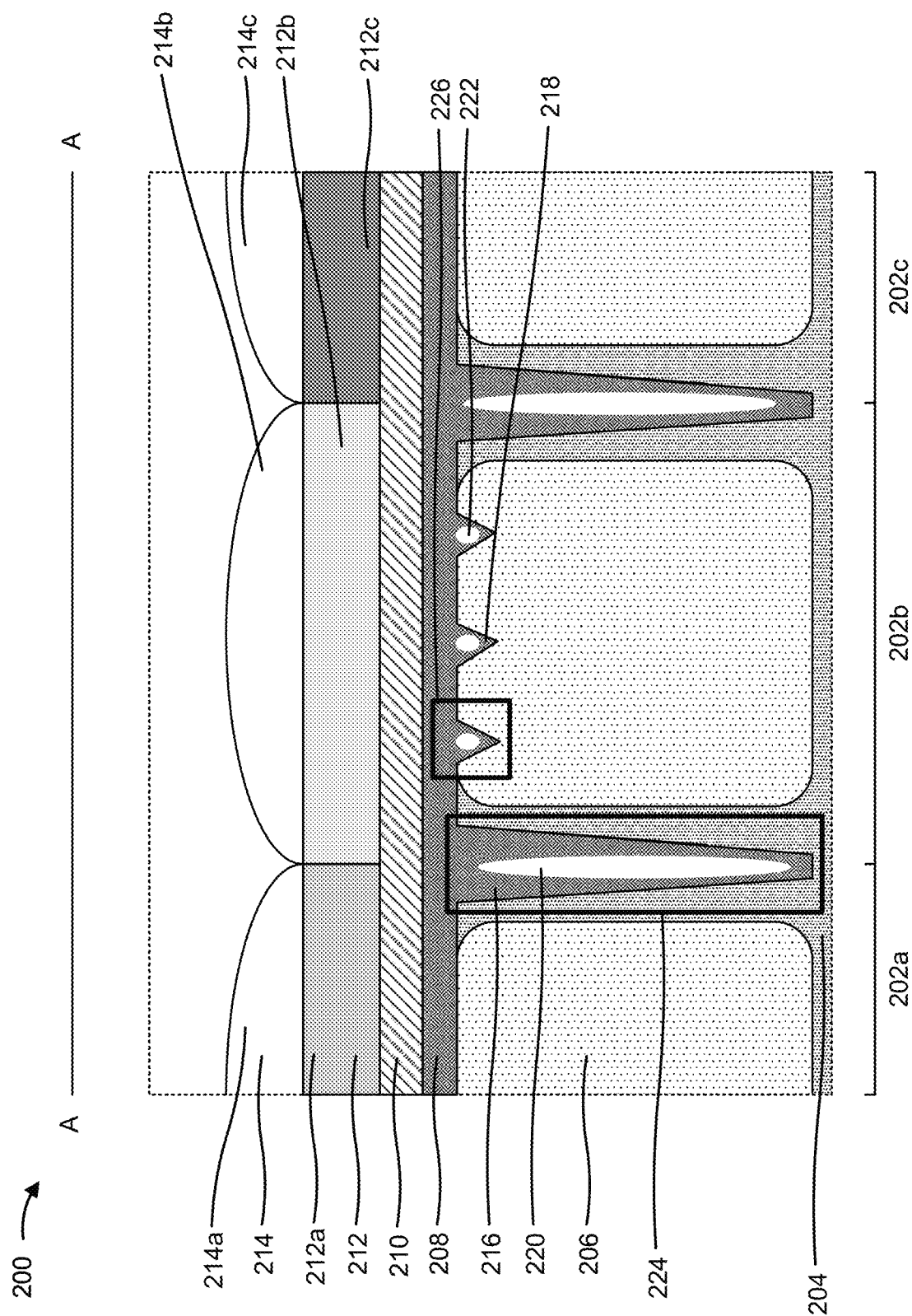

FIGS. 2A-2D are diagrams of an example pixel array 200 (or a portion thereof) described herein. The pixel array 200 may be included in an image sensor, such as a CMOS image sensor or another type of image sensor. FIG. 2A shows a top-down view of the pixel array 200. As shown in FIG. 2A, the pixel array 200 may include a plurality of pixel regions 202. As further shown in FIG. 2A, the pixel regions 202 may be square-shaped or rectangular-shaped and may be arranged in a grid. In some implementations, the pixel regions 202 may include other shapes such as circle shapes, octagon shapes, diamond shapes, and/or other shapes.

The pixel array 200 may be electrically connected to a back-end-of-line (BEOL) metallization stack (not shown) of the image sensor. The BEOL metallization stack may electrically connect the pixel array 200 to control circuitry that may be used to measure the accumulation of incident light in the pixel regions 202 and convert the measurements to an electrical signal.

FIG. 2B shows a cross-sectional view of a portion of the pixel array 200 along line AA in FIG. 2A. The portion of the pixel array 200 illustrated in FIG. 2B may include a plurality of adjacent pixel regions 202, such as pixel region 202a, pixel region 202b, and pixel region 202c. As shown in FIG. 2B, each of the pixel regions 202 may be formed in a substrate 204, which may include a semiconductor die substrate, a semiconductor wafer, or another type of substrate in which semiconductor pixels may be formed. In some implementations, the substrate 204 is formed of silicon, a material including silicon, a III-V compound semiconductor material such as gallium arsenide (GaAs), a silicon on insulator (SOI), or another type of semiconductor material that is capable of generating a charge from photons of incident light.

Each pixel region 202 may include a photodiode 206. A photodiode 206 may include a region of the substrate 204 that is doped with a plurality of types of ions to form a p-n junction or a PIN junction (e.g., a junction between a p-type portion, an intrinsic (or undoped) type portion, and an n-type portion). For example, the substrate 204 may be doped with an n-type dopant to form a first portion (e.g., an n-type portion) of a photodiode 206 and a p-type dopant to form a second portion (e.g., a p-type portion) of the photodiode 206. A photodiode 206 may be configured to absorb photons of incident light. The absorption of photons causes a photodiode 206 to accumulate a charge (referred to as a photocurrent) due to the photoelectric effect. Here, photons bombard the photodiode 206, which causes emission of electrons of the photodiode 206. The emission of electrons causes the formation of electron-hole pairs, where the electrons migrate toward the cathode of the photodiode 206 and the holes migrate toward the anode, which produces the photocurrent.

The pixel array 200 may include an oxide layer 208 above and/or on the substrate 204 and the photodiodes 206. The oxide layer 208 may function as a passivation layer between the photodiodes 206 and the upper layers of the pixel array 200. In some implementations, the oxide layer 208 includes an oxide material such as a silicon oxide ($SiO_x$). In some implementations, a silicon nitride ($SiN_x$), a silicon carbide ($SiC_x$), or a mixture thereof, such as a silicon carbon nitride (SiCN), a silicon oxynitride (SiON), or another dielectric material is used in place of the oxide layer 208 as a passivation layer.

The pixel array 200 may include an antireflective coating 210 above and/or on the oxide layer 208. The antireflective coating 210 may include a suitable material for reducing a reflection of incident light projected toward the photodiodes 206. For example, the antireflective coating 210 may include nitrogen-containing material. In some implementations, a semiconductor processing tool (e.g., deposition tool 102) may form the antireflective coating 210 to a thickness in a range from approximately 200 angstroms to approximately 1000 angstroms.

The pixel array 200 may include a color filter layer 212 above and/or on the antireflective coating 210. The color filter layer 212 may include an array of color filter regions, where each color filter region filters incident light to allow a particular wavelength of the incident light to pass to a photodiode 206 of an associated pixel region 202. For example, the color filter region 212a may filter incident light for the pixel region 202a, the color filter region 212b may filter incident light for the pixel region 202b, the color filter region 212b may filter incident light for the pixel region 202c, and so on. A color filter region may, for example, be a blue color filter region that permits the component of incident light near a 450 nanometer wavelength to pass through the color filter layer 212 and blocks other wavelengths from passing. Another color filter region may, for example, be a green color filter region that permits the component of incident light near a 550 nanometer wavelength to pass through the color filter layer 212 and blocks other wavelengths from passing. Another color filter region may, for example, be a red color filter region that permits the component of incident light near a 650 nanometer wavelength to pass through the color filter layer 212 and blocks other wavelengths from passing.

In some implementations, the color filter layer 212 is omitted for one or more pixel regions 202 in the pixel array 200. For example, the color filter layer 212 may be omitted from a white pixel region 202 to permit all wavelengths of light to pass into the associated photodiode 206 (e.g., for purposes of determining overall brightness to increase light sensitivity for the image sensor). As another example, the color filter layer 212 may be omitted from a near infrared (NIR) pixel region 202 to permit near infrared light to pass into the associated photodiode 206.

The pixel array 200 may include a micro-lens layer 214 above and/or on the color filter layer 212. The micro-lens layer 214 may include a micro-lens for each of the pixel regions 202. For example, a micro-lens 214a may be formed to focus incident light toward the photodiode 206 of the pixel region 202a, a micro-lens 214b may be formed to focus incident light toward the photodiode 206 of the pixel region 202b, a micro-lens 214c may be formed to focus incident light toward the photodiode 206 of the pixel region 202c, and so on.

In some implementations, the image sensor is a BSI CMOS image sensor. In these examples, the oxide layer 208, the antireflective coating 210, the color filter layer 212, and the micro-lenses 214 may be formed on a backside of the substrate 204. Moreover, one or more DTI structures 216 may be formed in the backside of the substrate 204 to provide optical isolation between the pixel regions 202, and thus may be referred to as BDTI structures. The DTI structure(s) 216 may be trenches (e.g., deep trenches) that are partially filled with a material (e.g., an oxide material such as a silicon oxide (SiOx) or another dielectric material) and provide optical isolation between pixel regions 202. The DTI structure(s) 216 may be formed in a grid layout in which the DTI structure(s) 216 extend laterally across the image sensor and intersect at various locations of the image sensor.

One or more high absorption regions 218 may be formed in each of the photodiodes 206 to increase the absorption of incident light by the photodiodes 206. A high absorption region 218 may include a shallow v-shaped (or another cross-sectional shape) trench that is formed in an associated photodiode 206. In some implementations, a plurality of high absorption regions 218 may be formed in a photodiode 206. In these examples, the plurality of high absorption regions 218 may be arranged in a periodic, zig-zag, or saw-toothed structure. In some implementations, the high absorption region(s) 218 have a pitch or width in a range of approximately 0.01 microns to approximately 8 microns. In some implementations, the high absorption region(s) 218 have a height in a range of approximately 2 microns to approximately 20 microns. In some implementations, the high absorption region(s) 218 may be cone shaped, pyramid shaped, or another three-dimensional shape.

In some implementations, a high absorption layer may be formed in the DTI structure(s) 216 and in the high absorption region(s) 218 to increase the absorption of incident light. The high absorption layer may be formed of a semiconductor material that has a low energy bandgap. The low energy bandgap may be, for example, an energy bandgap that is less than about 1 electron volt (eV). Further, the low energy bandgap may be, for example, an energy bandgap that is less than an energy bandgap of the substrate 204. For example, the high absorption layer may include silicon germanium or monocrystalline silicon doped with a chalcogen (e.g., sulfur, selenium, or tellurium).

The one or more DTI structures 216 may each include an air gap 220 to increase the optical isolation between the photodiodes 206 and to reduce optical crosstalk between the photodiodes 206. Similarly, each of the one or more high absorption regions 218 may include an air gap 222 to increase the optical isolation between the photodiodes 206 and to reduce optical crosstalk between the photodiodes 206. Air has the lowest refractive index of all materials and is the closest to the refractive index of a vacuum. The low refractive index of air relative to the refractive index of the material in the DTI structure(s) 216 (which may include an oxide or another type of material) lowers the critical angle for a total internal reflection at the boundary between the material and the air gap 220 in the DTI structure(s) 216. Thus, as shown in FIG. 2B, incident light traveling toward the boundary between the material and the air gap 220 at an angle that is equal to or greater than the critical angle will likely be totally reflected off of the material-air gap boundary. Thus, the lower critical angle increases the likelihood that a total internal reflection of incident light will occur in a DTI stricture 216, which will cause the incident light to reflect off of the material-air gap boundary and be absorbed by an associated pixel region 202 (e.g., pixel region 202b) as opposed (or in addition) to the incident light traveling through the DTI structure 216 and being absorbed by an adjacent (or non-adjacent) pixel region 202 (e.g., pixel region 202a).

Similarly the low refractive index of air relative to the refractive index of the material in the high absorption region(s) 218 (which may include an oxide or another type of material) lowers the critical angle for a total internal reflection at the boundary between the material and the air gap 222 in the high absorption region(s) 218. Thus, as shown in FIG. 2B, incident light traveling toward the boundary between the material and the air gap 222 at an angle that is equal to or greater than the critical angle will likely be totally reflected off of the material-air gap boundary. Thus, the lower critical angle increases the likelihood that a total internal reflection of incident light will occur in a high absorption region 218, which will cause the incident light to reflect off of the material-air gap boundary and be absorbed by an associated pixel region 202 (e.g., pixel region 202b) as opposed (or in addition) to the incident light traveling through the high absorption region 218 and being absorbed by an adjacent (or non-adjacent) pixel region 202 (e.g., pixel region 202c).

Moreover, as the physical size of image sensors continue to shrink, the dimensions of the DTI structure(s) 216 included therein also continue to reduce. The reduction in size of the DTI structure(s) 216 may result in breakage and/or damage to the DTI structure(s) 216 if the DTI structure(s) 216 are fully filled with an oxide material (e.g., filled to at least 95% of the area in the DTI structure(s) 216). Incorporating air gaps 220 into the DTI structure(s) 216 may reduce stress on the DTI structure(s) 216, which reduce the likelihood of breakage and/or damage as the size of the DTI structure(s) 216 continue to shrink.

Figure 2C:
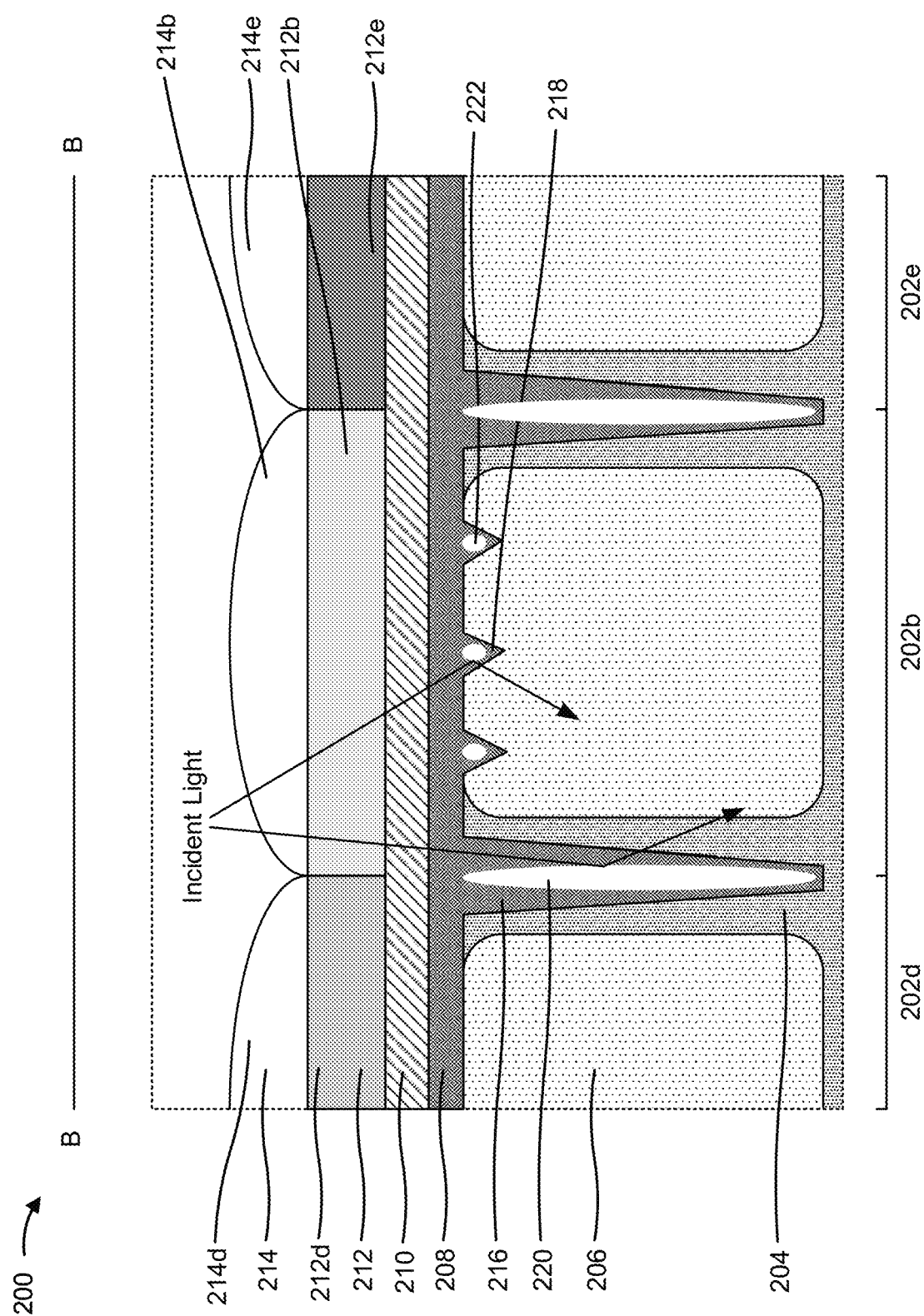

FIG. 2C shows a cross-sectional view of a portion of the pixel array 200 along line BB in FIG. 2A. The portion of the pixel array 200 illustrated in FIG. 2C may include a plurality of non-adjacent pixel regions 202, such as pixel region 202d, pixel region 202b, and pixel region 202e. As shown in FIG. 2C, the pixel regions 202d, 202b, and 202e may include similarly arranged structures as illustrated in FIG. 2B. However, the pixel regions 202d, 202b, and 202e may be diagonally arranged, in which case the DTI structures 216 (and the air gaps 220 formed therein) between the pixel regions 202d, 202b, and 202e may be slightly larger in size compared to the DTI structures 216 (and the air gaps 220 formed therein) between the pixel regions 202a, 202b, and 202c.

Figure 2D:
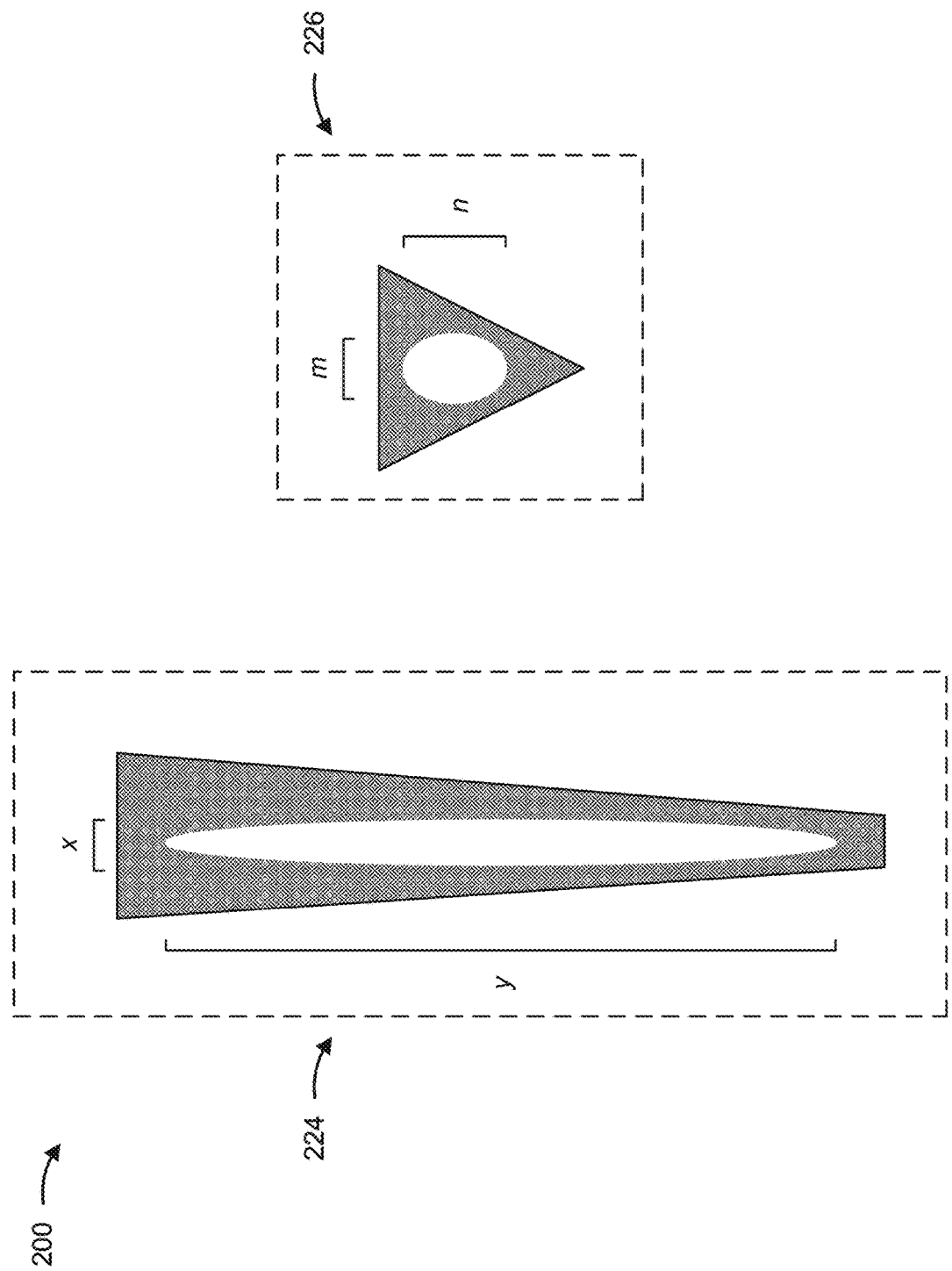

FIG. 2D shows a close-up view 224 of an example DTI structure 216 and a close-up view 226 of an example high absorption region 218 from FIG. 2B. As shown in the close-up view 224 of the example DTI structure 216, the air gap 220 formed therein may be formed such that a width x of the air gap 220 is in a range of approximately 0.7 microns to approximately 1.3 microns. Moreover, the air gap 220 formed therein may be formed such that a height y of the air gap 220 is in a range of approximately 1.5 microns to approximately 10 microns. In some implementations, the air gap 220 is formed to occupy at least 75% of the area in the DTI structure 216 such that the material (e.g., the oxide material) in the DTI structure 216 occupies 25% or less of the area in the DTI structure 216. Forming the air gap 220 to occupy at least 75% of the area in the DTI structure 216 reduces and/or minimizes the crosstalk (including optical crosstalk and electrical crosstalk) between adjacent (or non-adjacent) pixel regions. For example, forming the air gap 220 to occupy at least 75% of the area in the DTI structure 216 between pixel region 202a and pixel region 202b reduces and/or minimizes the crosstalk (including optical crosstalk and electrical crosstalk) between pixel region 202a and pixel region 202b.

As shown in the close-up view 226 of the example high absorption region 218, the air gap 222 formed therein may be formed such that a width m of the air gap 222 is in a range of approximately 1500 angstroms to approximately 4000 angstroms. Moreover, the air gap 222 formed therein may be formed such that a height n of the air gap 222 is in a range of approximately 2000 angstroms to approximately 4000 angstroms. In some implementations, the air gap 222 is formed to occupy at least 75% of the area in the high absorption region 218 such that the material (e.g., the oxide material) in the high absorption region 218 occupies 25% or less of the area in the high absorption region 218.

The number and arrangement of components, structures, and/or layers shown in FIGS. 2A-2D are provided as one or more examples. In practice, there may be additional components, structures, and/or layers; fewer components, structures, and/or layers; different components, structures, and/or layers; and/or differently arranged components, structures, and/or layers than those shown in FIGS. 2A-2D.

Figure 3A:
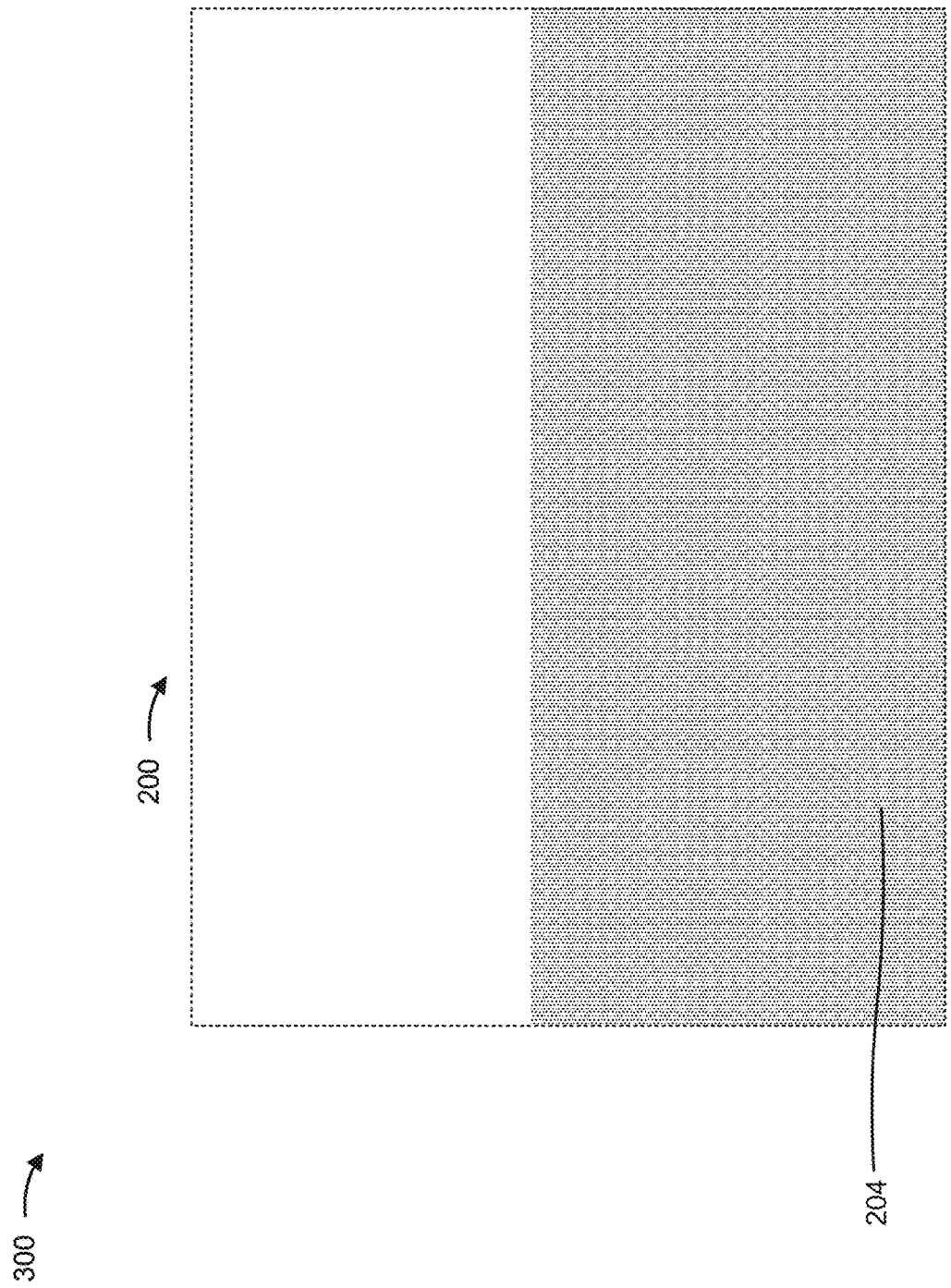

FIGS. 3A-3J are diagrams of an example 300 of forming the pixel array 200 of FIGS. 2A-2D described herein. In particular, FIGS. 3A-3J illustrate cross-sectional views of the example 300 of forming the pixel array 200. The pixel array 200 may be formed as part of an image sensor (e.g., a CMOS image sensor) manufacturing process. As shown in FIG. 3A, the pixel array 200 may be formed in the substrate 204. As described above, the substrate 204 may be a semiconductor die (or a portion thereof), a semiconductor wafer (or a portion thereof), or another type of substrate in which pixel arrays may be formed.

As shown in FIG. 3B, a plurality of pixel regions 202 of the pixel array 200 may be formed in the substrate 204. For example, a pixel region 202a may be formed by doping a portion of the substrate 204, a pixel region 202b may be formed by doping another portion of the substrate 204, a pixel region 202c may be formed by doping another portion of the substrate 204, and so on. Some of the pixel regions 202 may be adjacent pixel regions (e.g., pixel regions that are next to and/or share a side with each other) and some of the pixel regions 202 may be non-adjacent pixel regions (e.g., pixel regions that are diagonally across from each other).

In some implementations, a semiconductor processing tool such as the implantation tool 112 dopes the portions of the substrate 204 using an ion implantation technique to form a photodiode 206 in each of the pixel regions 202. In these examples, the semiconductor processing tool may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. In some implementations, other techniques and/or types of ion implantation tools are used to form the ion beam. The ion beam may be directed at the pixel regions 202 to implant ions in the substrate 204, thereby doping the substrate 204 to form the photodiodes 206 in each of the pixel regions 202.

The substrate 204 may be doped with a plurality of types of ions to form a p-n junction for each photodiode 206. For example, the substrate 204 may be doped with an n-type dopant to form a first portion (e.g., an n-type portion) of a photodiode 206 and a p-type dopant to form a second portion (e.g., a p-type portion) of the photodiode 206.

Figure 3C:
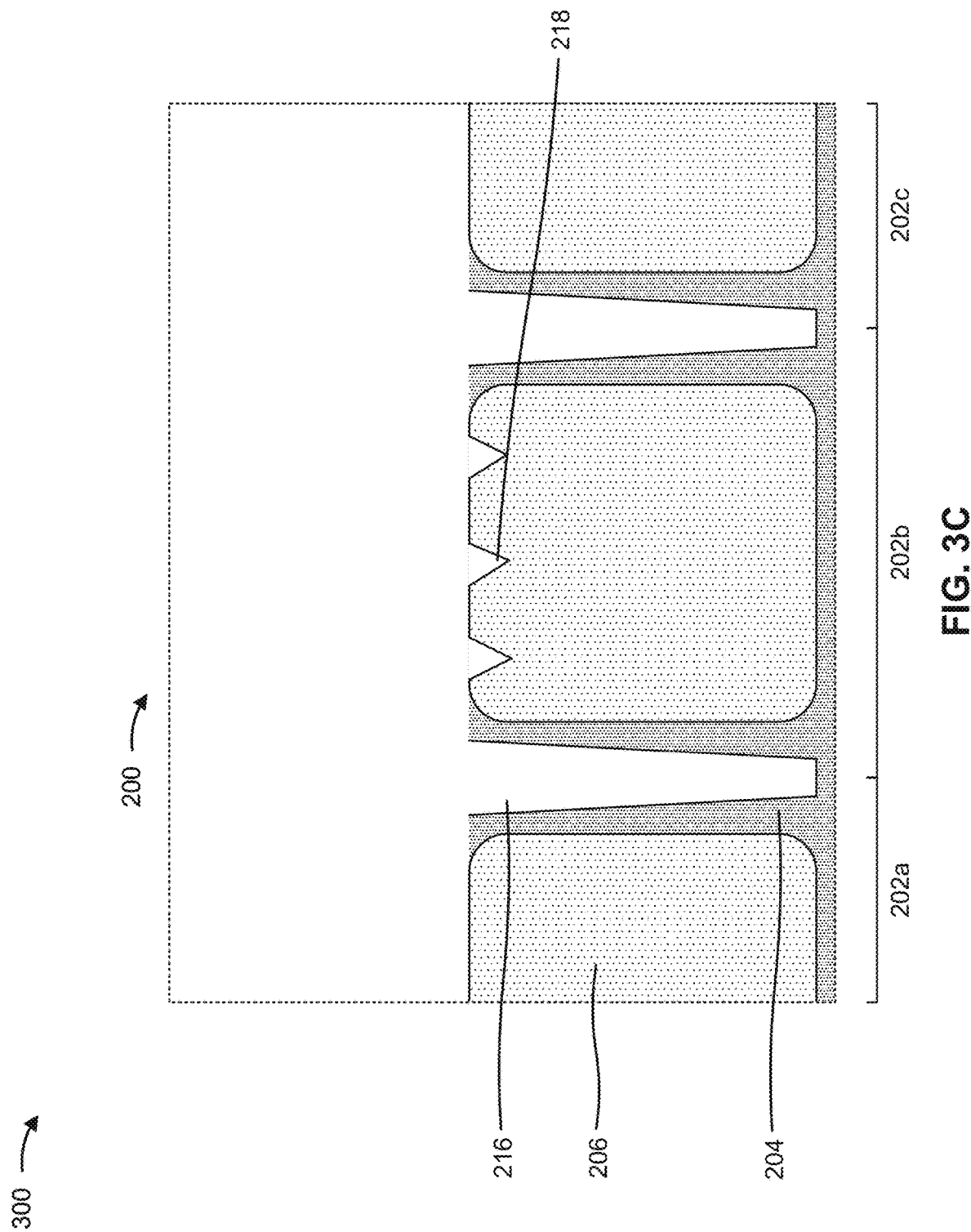

As shown in FIG. 3C, one or more DTI structures 216 may be formed in the substrate 204. In particular, a DTI structure 216 may be formed between each of the photodiodes 206 of the pixel regions 202. As an example, a DTI structure 216 may be formed between the photodiodes 206 of the pixel region 202a and the pixel region 202b, a DTI structure 216 may be formed between the photodiodes 206 of the pixel region 202b and the pixel region 202b, and so on. In some implementations, if the pixel array 200 is a BSI pixel array, the DTI structure(s) 216 may be backside DTI (BDTI) structures formed in a backside of the substrate 204.

In some implementations, one or more semiconductor processing tools may be used to form the one or more DTI structures 216 in the substrate 204. For example, the deposition tool 102 may form a photoresist layer on the substrate 204, the exposure tool 104 may expose the photoresist layer to a radiation source to pattern the photoresist layer, the developer tool 106 may develop and remove portions of the photoresist layer to expose the pattern, and the etching tool 108 may etch the one or more portions of substrate 204 to form the one or more DTI structures 216 in the substrate 204. In some implementations, a photoresist removal tool removes the remaining portions of the photoresist layer (e.g., using a chemical stripper and/or another technique) after the etching tool 108 etches the substrate 204.

As further shown in FIG. 3C, one or more high absorption regions 218 may be formed in the substrate 204 and/or each of the photodiodes 206. Each high absorption region 218 may be defined by a shallow trench. A plurality of adjacent high absorption regions 218 may form a periodic or zig-zag structure that is etched or otherwise formed in the substrate 204 and/or the photodiode(s) 206. The one or more high absorption regions 218 may be formed in a same side of the substrate 204 as the one or more DTI structures 216, and may be formed using similar techniques and/or semiconductor processes as described above in connection with forming the one or more DTI structures 216.

Figure 3D:
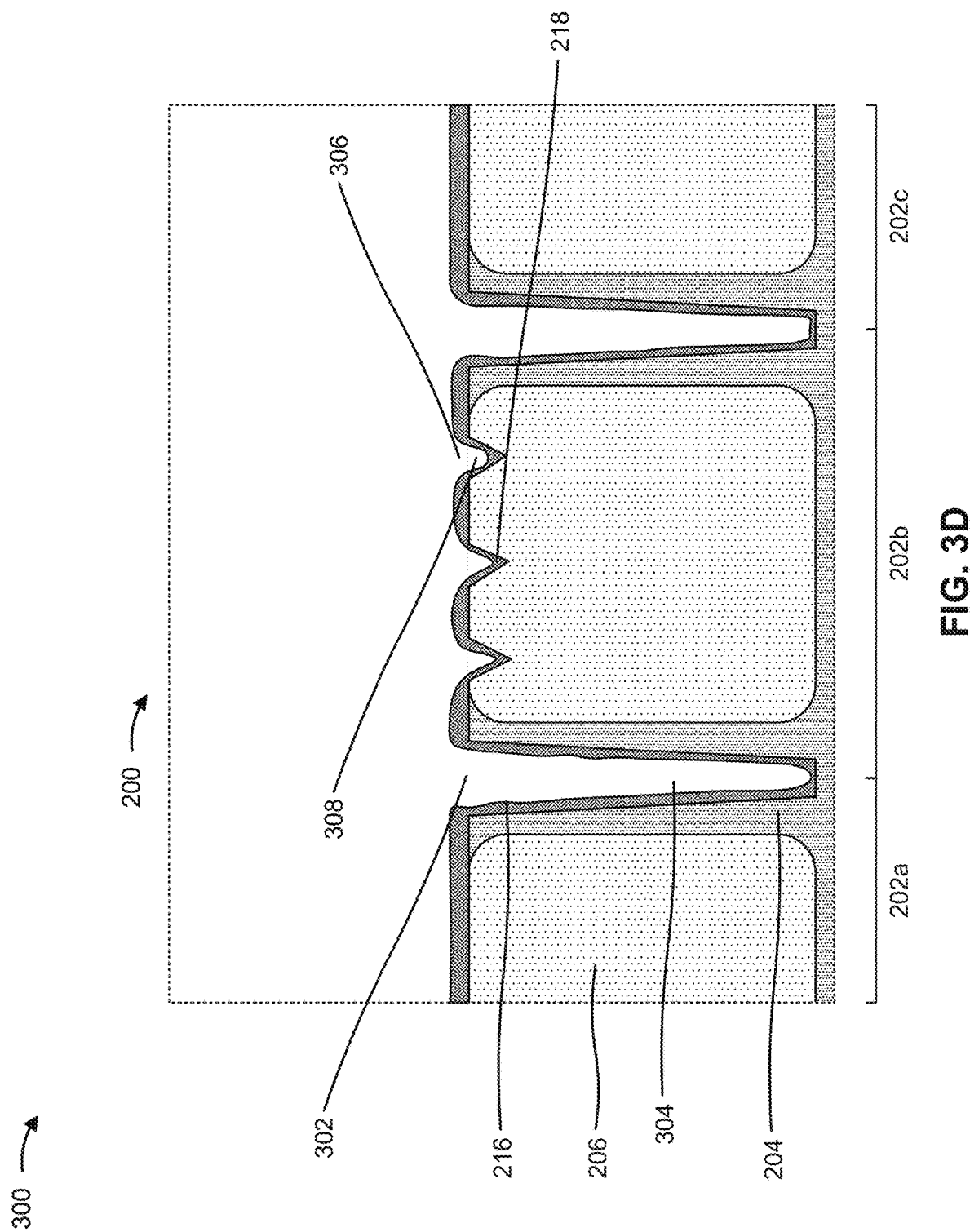
Figure 3E:
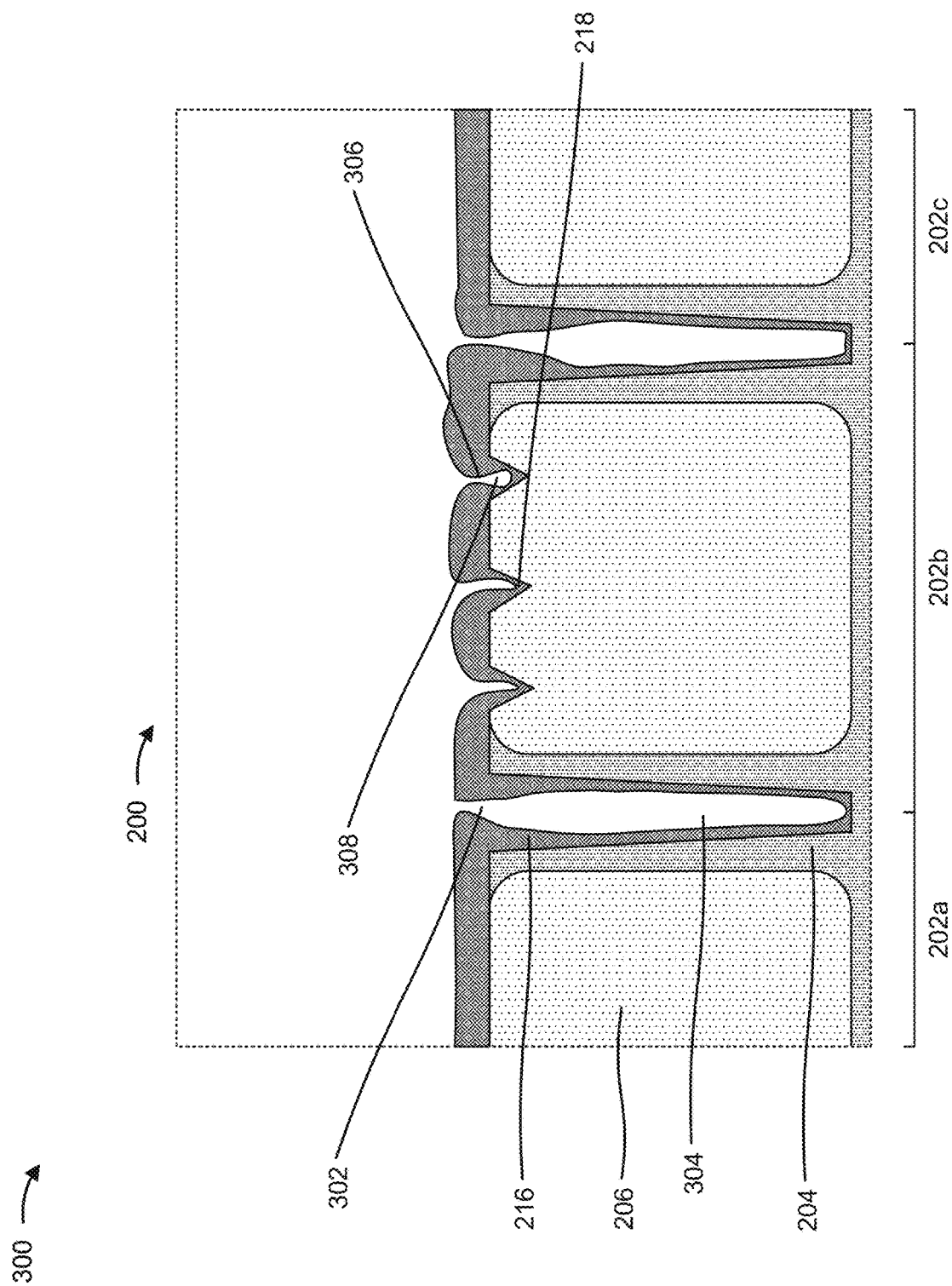

As shown in FIGS. 3D-3E, the one or more DTI structures 216 and the one or more high absorption regions 218 may each be partially filled with a material such that an air gap 220 is formed in each of the one or more DTI structures 216 and an air gap 222 is formed in each of the one or more high absorption regions 218. In particular, a semiconductor processing tool (e.g., the deposition tool 102) may deposit an oxide material (e.g., a silicon oxide ($SiO_x$) or another type of oxide) in each of the one or more DTI structures 216 at a deposition rate that causes a top portion 302 of the one or more DTI structures 216 to fill with the oxide material before a center portion 304 of the one or more DTI structures 216 can fill with the oxide material. This causes an unfilled void to form in each of the one or more DTI structures 216, thereby resulting in formation of the air gaps 220. In a similar manner, the semiconductor processing tool may deposit the oxide material in each of the one or more high absorption regions 218 at the deposition rate to cause a top portion 306 of the one or more high absorption regions 218 to fill with the oxide material before a center portion 308 of the one or more high absorption regions 218 can be filled with the oxide material. In some implementations, a deposition rate may be selected such that the air gaps 220 occupy at least 75% of the area in the DTI structures 216 (in which case the area in the DTI structures 216 occupied by the oxide material is 25% or less), and/or such that the air gaps 222 occupy at least 75% of the area in the high absorption regions 218 (in which case the area in the high absorption regions 218 occupied by the oxide material is 25% or less). In some implementations, a deposition rate in the range from approximately 2 angstroms per second (A/S) to approximately 300 A/S may be used. Moreover, the oxide material may be deposited using various CVD techniques and/or atomic layer deposition (ALD) techniques, such as PECVD, HDP-CVD, SACVD, or PEALD.

Figure 3F:
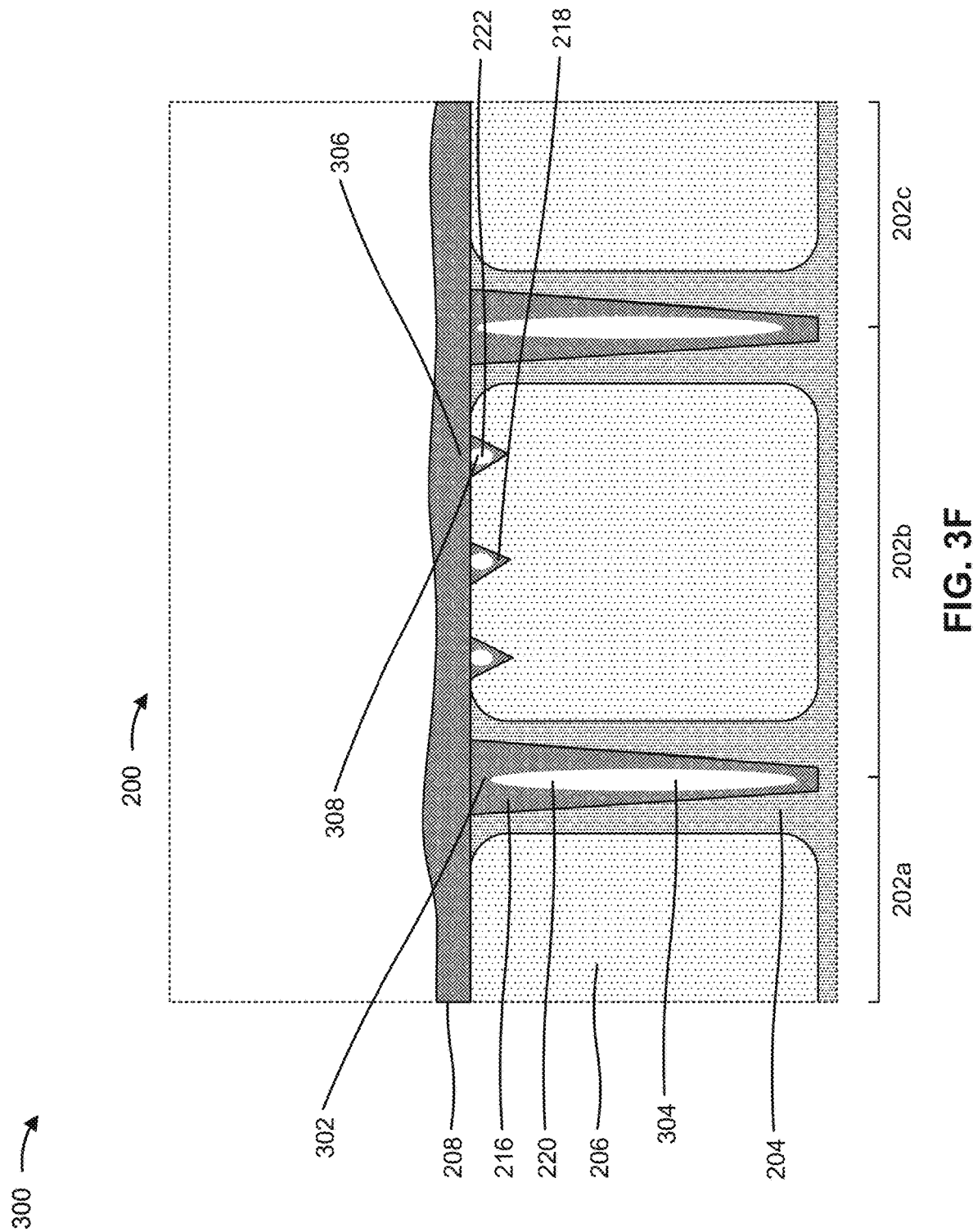

As shown in FIG. 3F, the semiconductor processing tool (e.g., the deposition tool 102) may further deposit the oxide material on the substrate 204 and one or more photodiodes 206 to form the oxide layer 208. As indicated above, the oxide layer 208 may function as a passivation layer. In some implementations, a silicon nitride ($SiN_x$), a silicon carbide ($SiC_x$), or a mixture thereof, such as a silicon carbon nitride (SiCN), a silicon oxynitride (SiON), or another dielectric material may be used in place of the oxide layer 208 as a passivation layer.

Figure 3G:
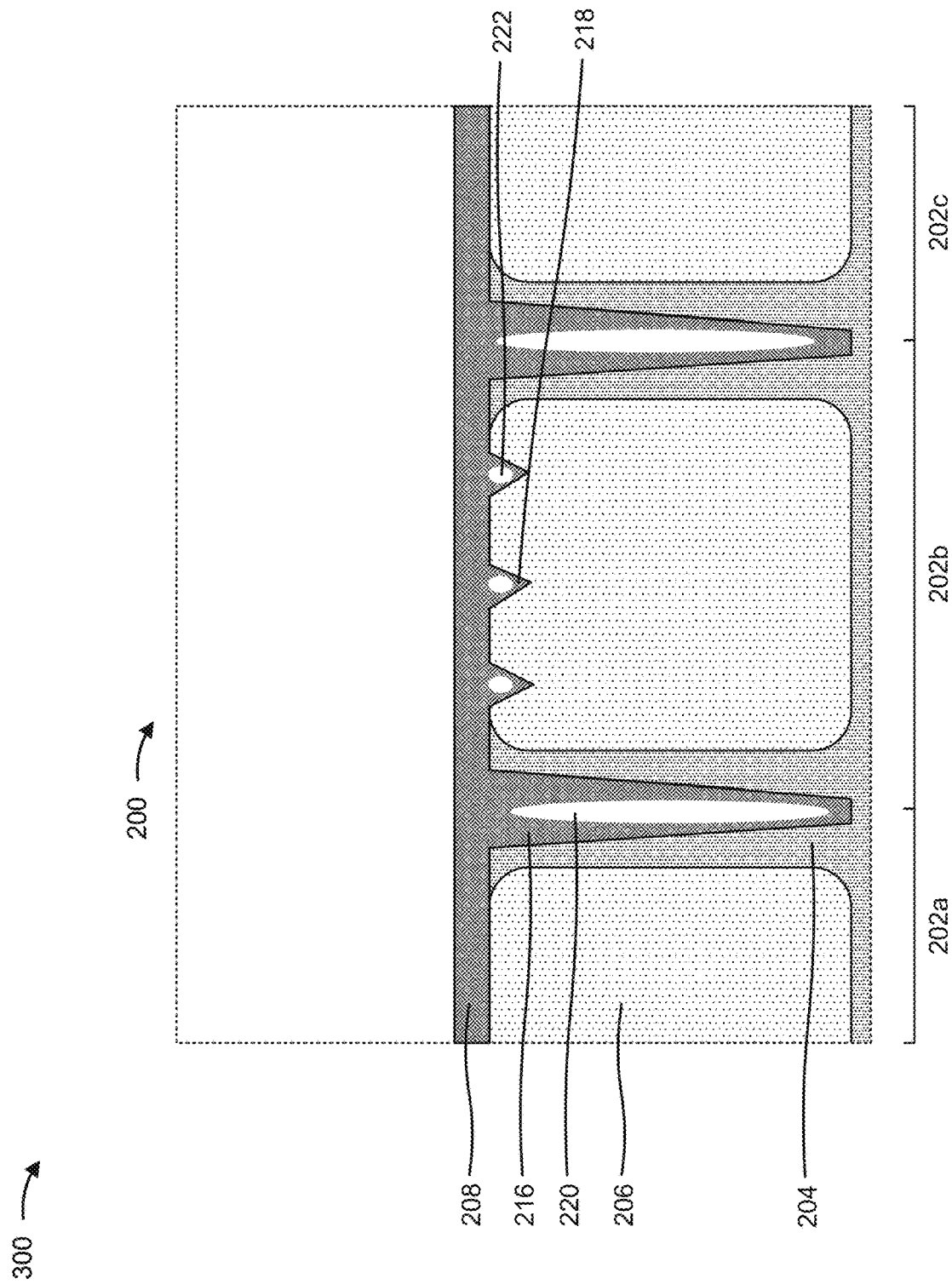

As shown in FIG. 3G, a semiconductor processing tool (e.g., the planarization tool 110) may polish or planarize the oxide layer 208 to flatten the oxide layer 208 in preparation for the deposition of additional layers and/or structures on the oxide layer 208. The oxide layer 208 may be planarized using a polishing or planarizing technique such as CMP. A CMP process may include depositing a slurry (or polishing compound) onto a polishing pad. The semiconductor die or wafer in which the pixel array 200 is formed may be mounted to a carrier, which may rotate the semiconductor die or wafer as the semiconductor die or wafer is pressed against the polishing pad. The slurry and polishing pad act as an abrasive that polishes or planarizes the oxide layer 208 as the semiconductor die or wafer is rotated. The polishing pad may also be rotated to ensure a continuous supply of slurry is applied to the polishing pad.

Figure 3H:
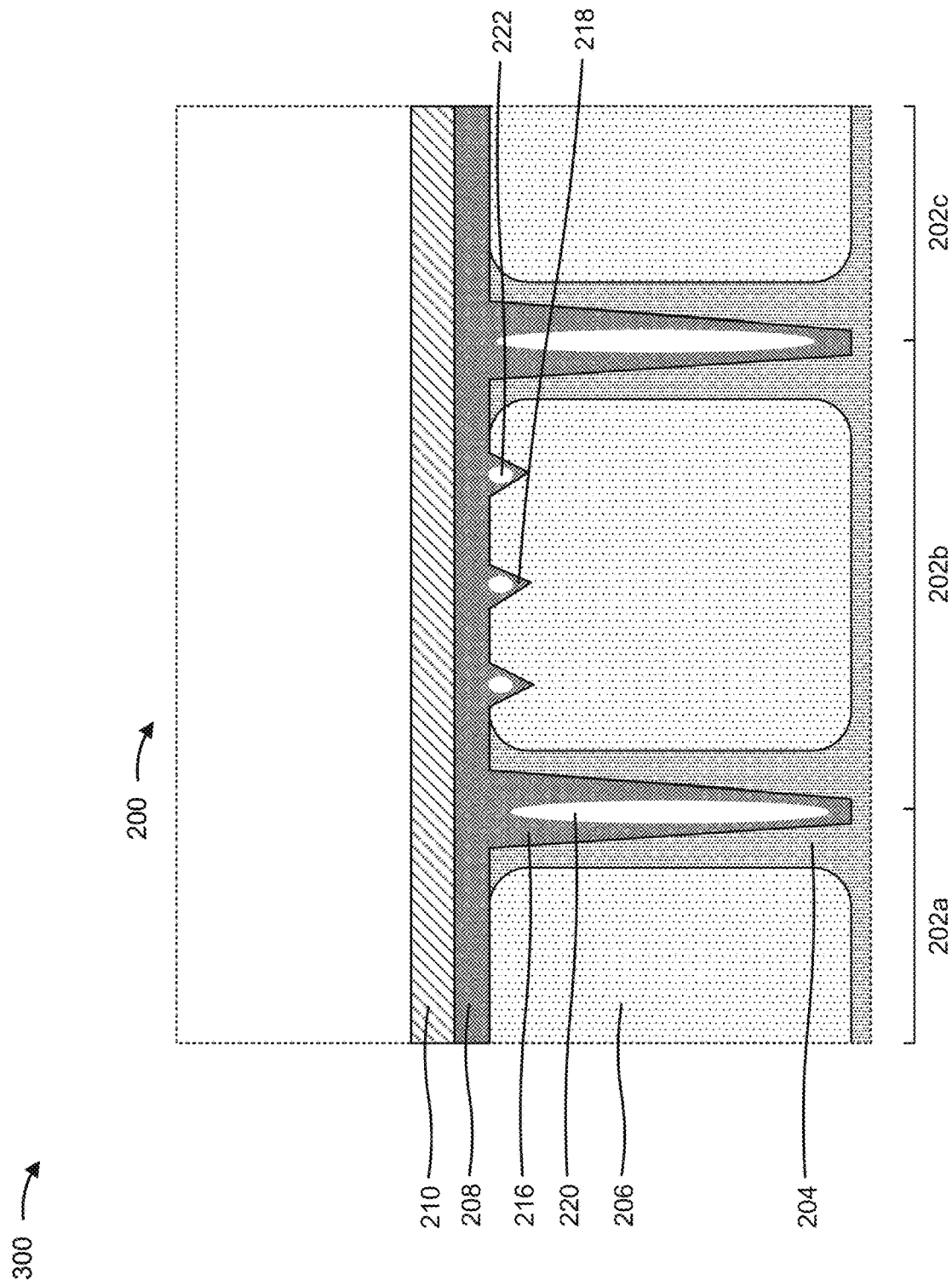

As shown in FIG. 3H, the antireflective coating 210 may be formed above and/or on the oxide layer 208. In particular, a semiconductor processing tool (e.g., the deposition tool 102) may deposit the antireflective coating 210 using a CVD technique, a PVD technique, an ALD technique, or another type of deposition technique. The antireflective coating 210 may include a suitable material for reducing a reflection of incident light projected toward the photodiodes 206. For example, the antireflective coating 210 may include nitrogen-containing material. In some implementations, the semiconductor processing tool may form the antireflective coating 210 to a thickness in a range from approximately 200 angstroms to approximately 1000 angstroms.

Figure 3I:
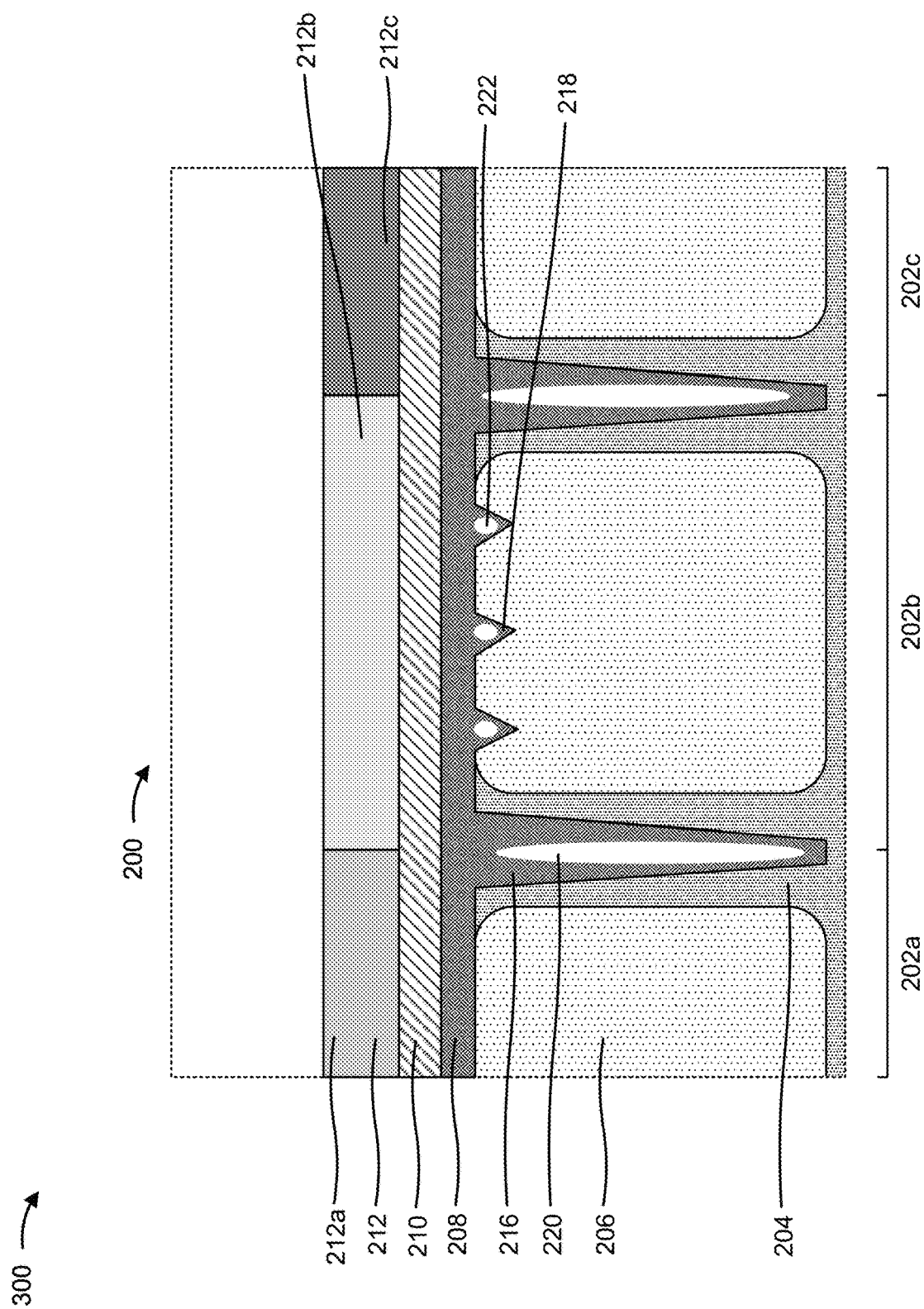

As shown in FIG. 3I, the color filter layer 212 may be formed above and/or over the antireflective coating 210. In particular, a semiconductor processing tool (e.g., the deposition tool 102) may deposit the color filter layer 212 using a CVD technique, a PVD technique, an ALD technique, or another type of deposition technique. The color filter layer 212 may be formed such that each color filter region in the color filter layer 212 is formed over an associated pixel region 202. For example the color filter layer 212 may be formed such that a color filter region 212a (e.g., that filters a wavelength range of incident light) is formed over the pixel region 202a, such that a color filter region 212b (e.g., that filters a wavelength range of incident light) is formed over the pixel region 202b, such that a color filter region 212c (e.g., that filters a wavelength range of incident light) is formed over the pixel region 202c, and so on.

Figure 3J:
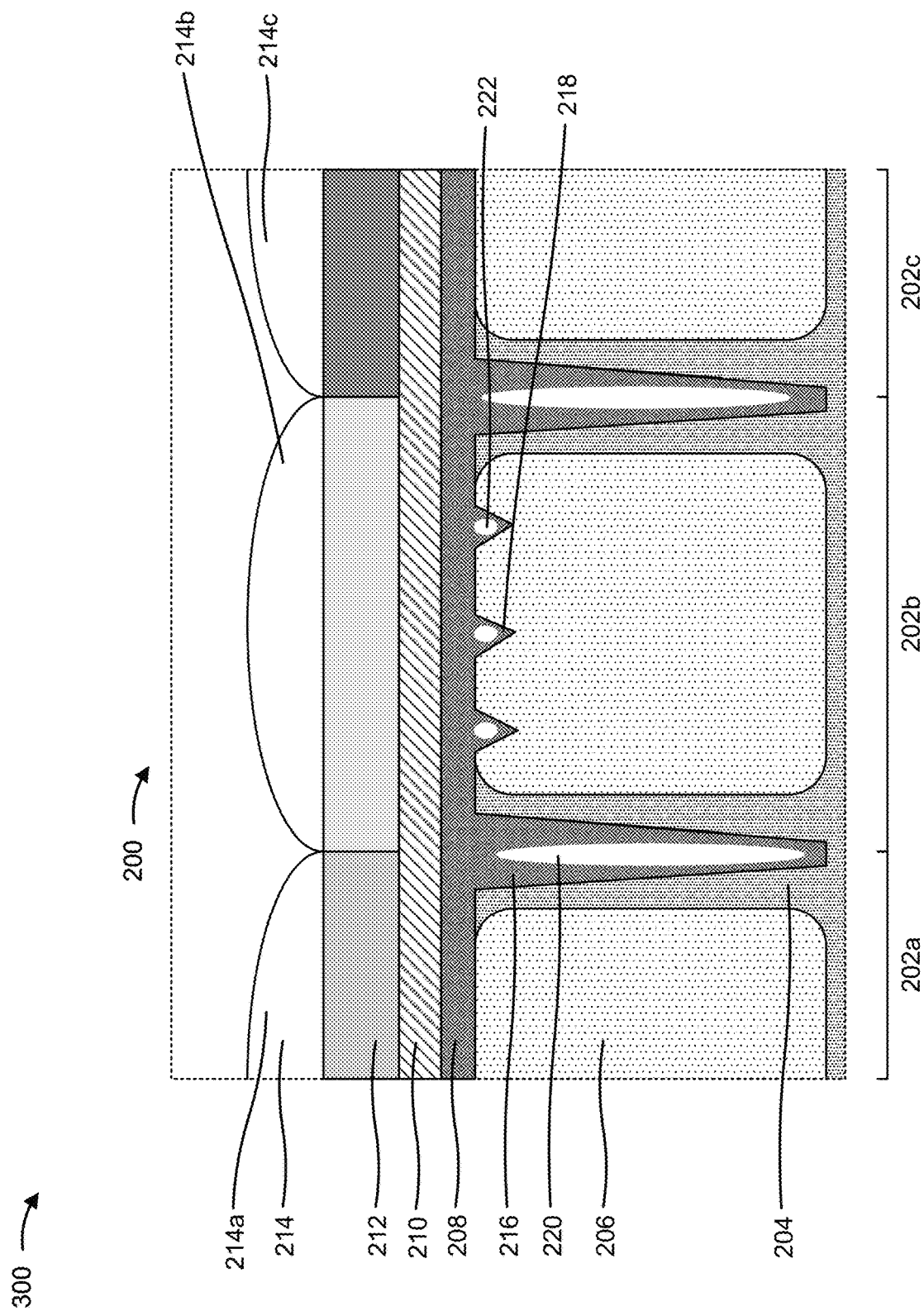

As shown in FIG. 3J, a micro-lens layer 214 may be formed above and/or on the antireflective coating 210. The micro-lens layer 214 may be formed such that each micro-lens in the micro lens layer 214 is formed over an associated pixel region 202. For example the micro-lens layer 214 may be formed such that a micro-lens 214a is formed over the pixel region 202a, such that a micro-lens 214b is formed over the pixel region 202b, such that a micro-lens 214c is formed over the pixel region 202c, and so on. The micro-lens layer 214 may, for example, be formed by a spin-on process or a deposition process and a reflow operation to curve upper or top surfaces of the micro-lenses.

As indicated above, FIGS. 3A-3J are provided as an example. Other examples may differ from what is described with regard to FIGS. 3A-3J.

Figure 4:
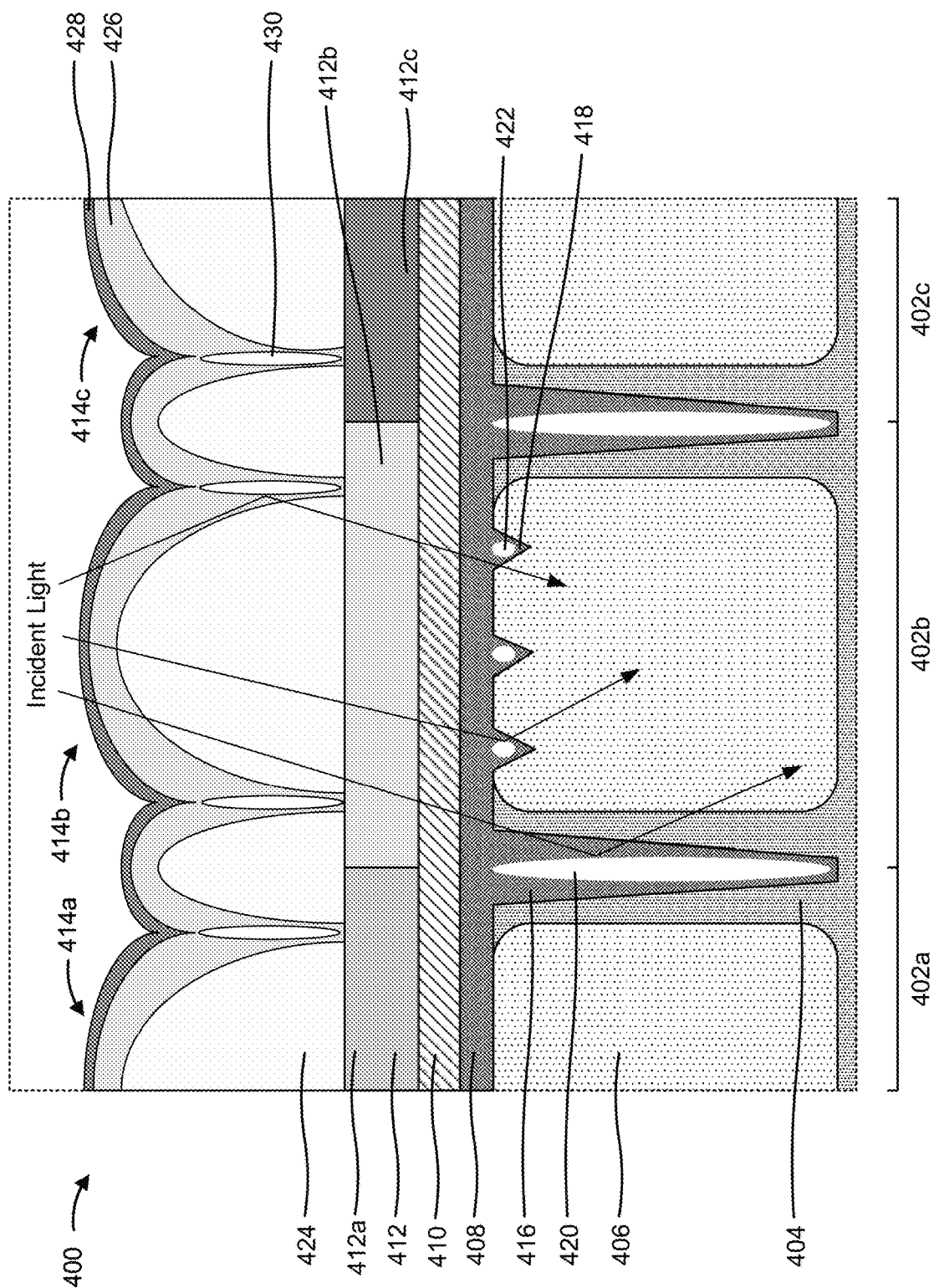
FIG. 4 is a diagram of another example pixel array described herein.

FIG. 4 is a diagram of another example pixel array 400 described herein. As shown in FIG. 4, the example pixel array 400 may include a similar arrangement of components, structures, and/or layers as the example pixel array 200. However, the example pixel array 400 includes a micro-lens system having air gaps formed therein to further reduce and/or minimize crosstalk (optical crosstalk and electrical crosstalk) between adjacent (and non-adjacent) pixel regions. The air gaps in the DTI structures between adjacent (and non-adjacent) pixel regions, and the air gaps in the micro-lens system may be capable of reflecting incident light across a broad spectrum of incident angles to further increase the quantum efficiency of the pixel array 400.

As shown in FIG. 4, the pixel array 400 may include one or more pixel regions 402 (e.g., pixel region 402a, pixel region 402b, pixel region 402c, and/or another pixel region) in a substrate 404 of an image sensor (e.g., a CMOS image sensor). Each pixel region 402 may include a photodiode 406. The pixel array 400 may include an oxide layer 408 above and/or on the substrate 404 and the photodiodes 406. The pixel array 400 may include an antireflective coating 410 above and/or on the oxide layer 408.

The pixel array 400 may include a color filter layer 412 above and/or on the antireflective coating 410. The color filter layer 412 may include an array of color filter regions, where each color filter region filters incident light to allow a particular wavelength of the incident light to pass to a photodiode 406 of an associated pixel region 402. For example, the color filter region 412a may filter incident light for the pixel region 402a, the color filter region 412b may filter incident light for the pixel region 402b, the color filter region 412c may filter incident light for the pixel region 402c, and so on.

The pixel array 400 may include a micro-lens layer 414 above and/or on the color filter layer 412. The micro-lens layer 414 may include a micro-lens for each of the pixel regions 402. For example, a micro-lens 414a may be formed to focus incident light toward the photodiode 406 of the pixel region 402a, a micro-lens 414b may be formed to focus incident light toward the photodiode 406 of the pixel region 402b, a micro-lens 414c may be formed to focus incident light toward the photodiode 406 of the pixel region 402c, and so on.

In some implementations, the image sensor is a BSI CMOS image sensor. In these examples, the oxide layer 408, the antireflective coating 410, the color filter layer 412, and the micro-lenses 414 may be formed on a backside of the substrate 404. Moreover, one or more DTI structures 416 may be formed in the backside of the substrate 404 to provide optical isolation between the pixel regions 402, and thus may be referred to as BDTI structures. High absorption regions 418 may be formed in each of the photodiodes 406 to increase the absorption of incident light by the photodiodes 406. The one or more DTI structures 416 may each include an air gap 420 to increase the optical isolation between the photodiodes 406 and to reduce optical crosstalk between the photodiodes 406. Similarly, each of the high absorption regions 418 may each include an air gap 422 to increase the optical isolation between the photodiodes 406 and to reduce optical crosstalk between the photodiodes 406.

As further shown in FIG. 4, the micro-lens layer 414 may be an air gap in situ micro-lens (AGML) that includes a plurality of components, structures, and/or layers. For example, the micro-lens layer 414 may include a plurality of micro-lens structures 424. The micro-lens structures 424 may be tapered structures that include a transparent material, a dielectric material, or another type of material. Adjacent micro-lens structures 424 may form tapered trenches. A dielectric film 426 may be included on the micro-lens structures 424 and in the tapered trenches to seal the tapered trenches. A passivation film 428 may be formed over and/or on the dielectric film 426 to increase the ability of the micro-lens layer 414 to focus incident light. The passivation film 428 may include a silicon nitride ($SiN_x$) or another material having a high refractive index and a higher refractive index relative to the dielectric film 426. The micro-lens layer 414 may be referred to an AGML in that air gaps 430 are formed in the dielectric film 426 in the tapered trenches. These air gaps 430 function in a similar manner to air gaps 420 and air gaps 422 in that the air gaps 430 reflect incident light (e.g., due to the total internal reflection phenomenon) in the micro-lens layer 414, which reduces optical crosstalk between adjacent (or non-adjacent) pixel regions (e.g., pixel region 402b and pixel region 402c).

The number and arrangement of components, structures, and/or layers shown in FIG. 4 are provided as one or more examples. In practice, there may be additional components, structures, and/or layers; fewer components, structures, and/or layers; different components, structures, and/or layers; and/or differently arranged components, structures, and/or layers than those shown in FIG. 4.

Figure 5A:
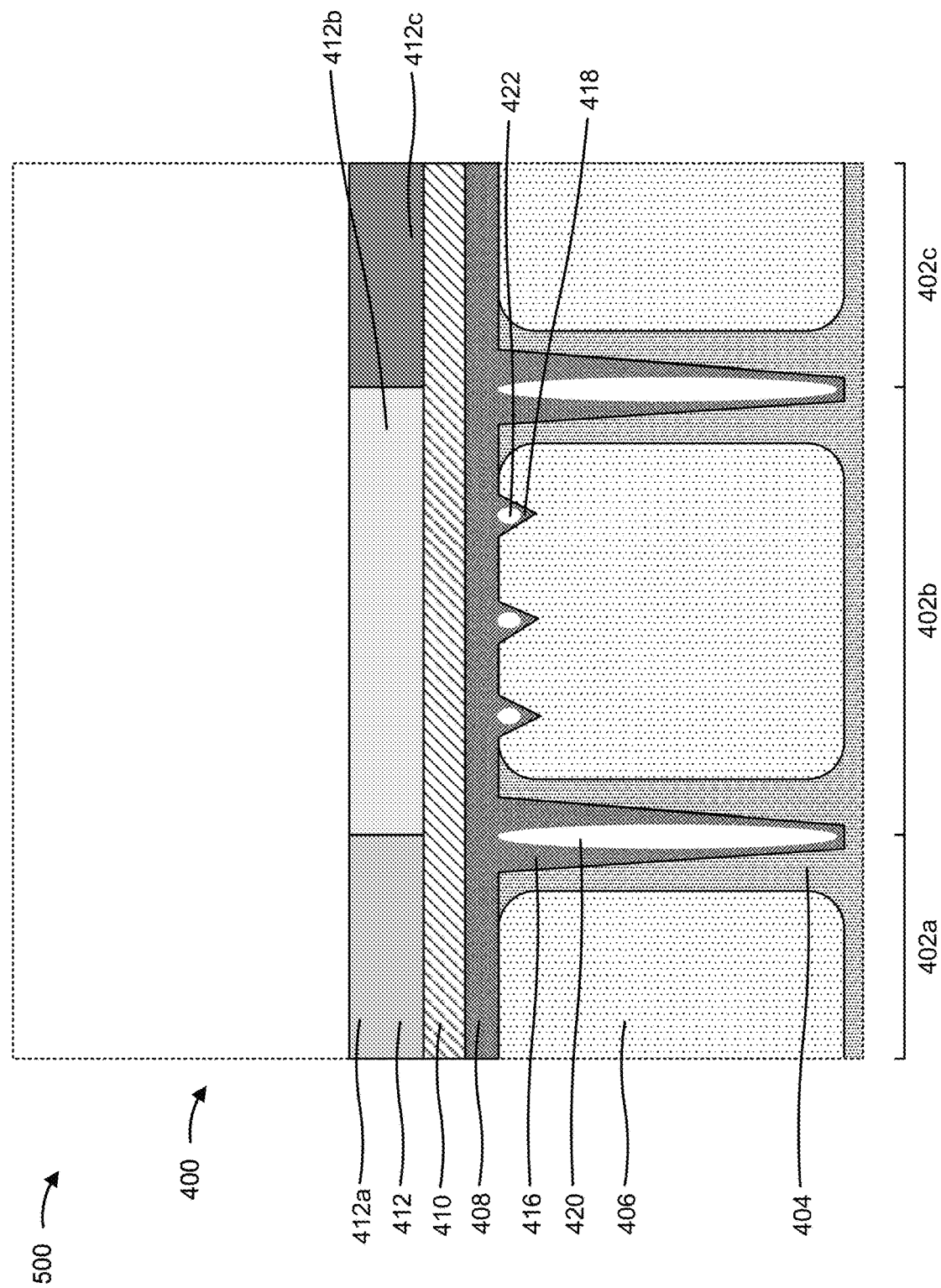
FIGS. 5A-5D are diagrams of an example of forming the pixel array of FIG. 4 described herein.

FIGS. 5A-5D are diagrams of an example of forming the pixel array 400 of FIG. 4 described herein. As shown in FIG. 5A, the processes and/or techniques used for the formation of the photodiodes 406, the oxide layer 408, the antireflective coating 410, the DTI structures 416, the high absorption regions 418, the air gaps 420, and the air gaps 422 may be similar to the processes and/or techniques described above in connection with FIGS. 3A-3J and are therefore omitted.

Figure 5B:
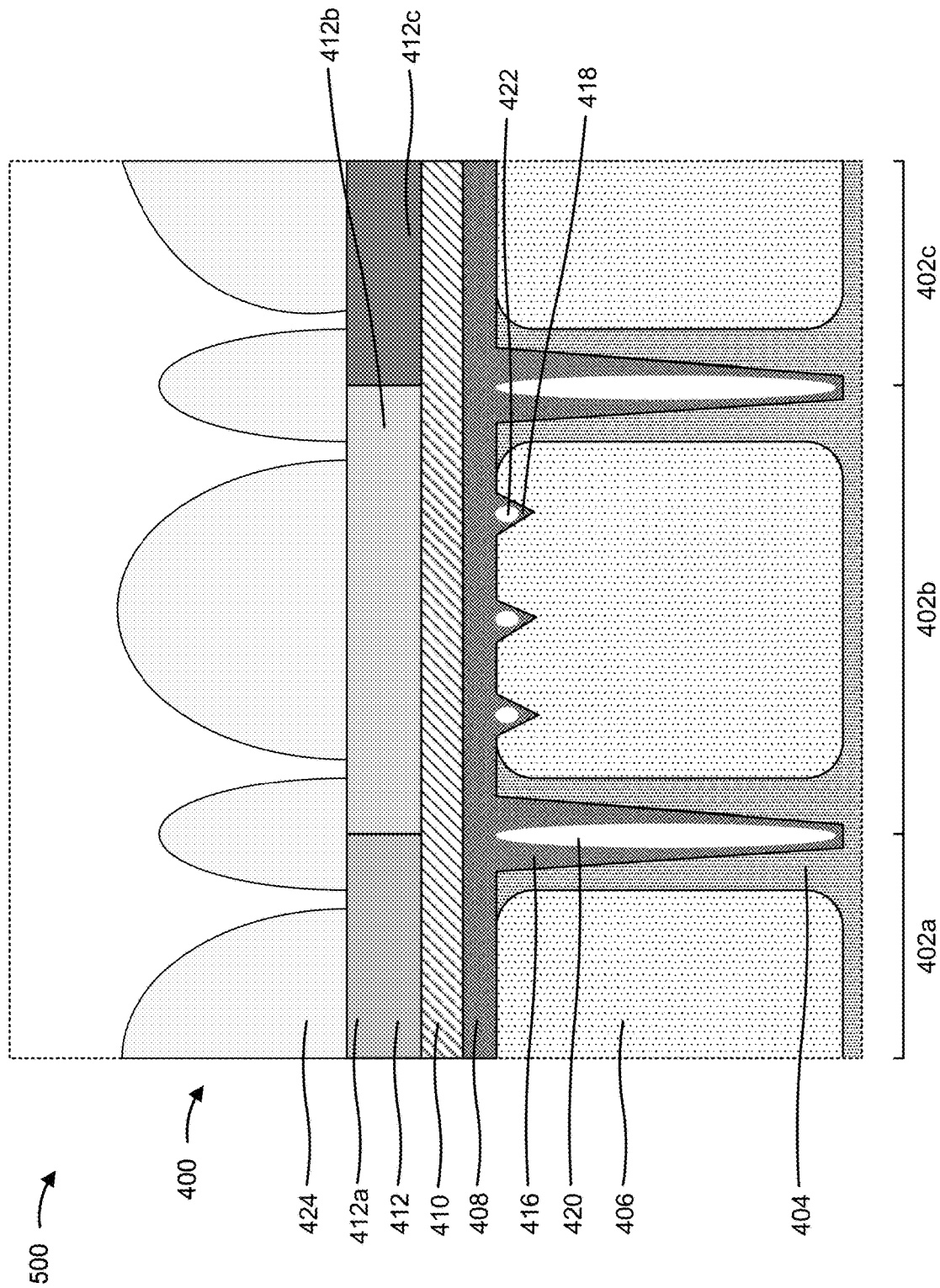

As shown in FIG. 5B, the micro-lens structures 424 may be formed above and/or on the color filter layer 412. In some implementations, one or more semiconductor processing tools may form the micro-lens structures 424. For example, the deposition tool 102 may form a photoresist layer on the color filter layer 412, the exposure tool 104 may expose the photoresist layer to a radiation source to pattern the photoresist layer, the developer tool 106 may develop and remove portions of the photoresist layer to expose the pattern, and the deposition tool 102 may deposit material in the removed portions to form the micro-lens structures 424. In some implementations, a photoresist removal tool removes the remaining portions of the photoresist layer (e.g., using a chemical stripper and/or another technique).

Figure 5C:
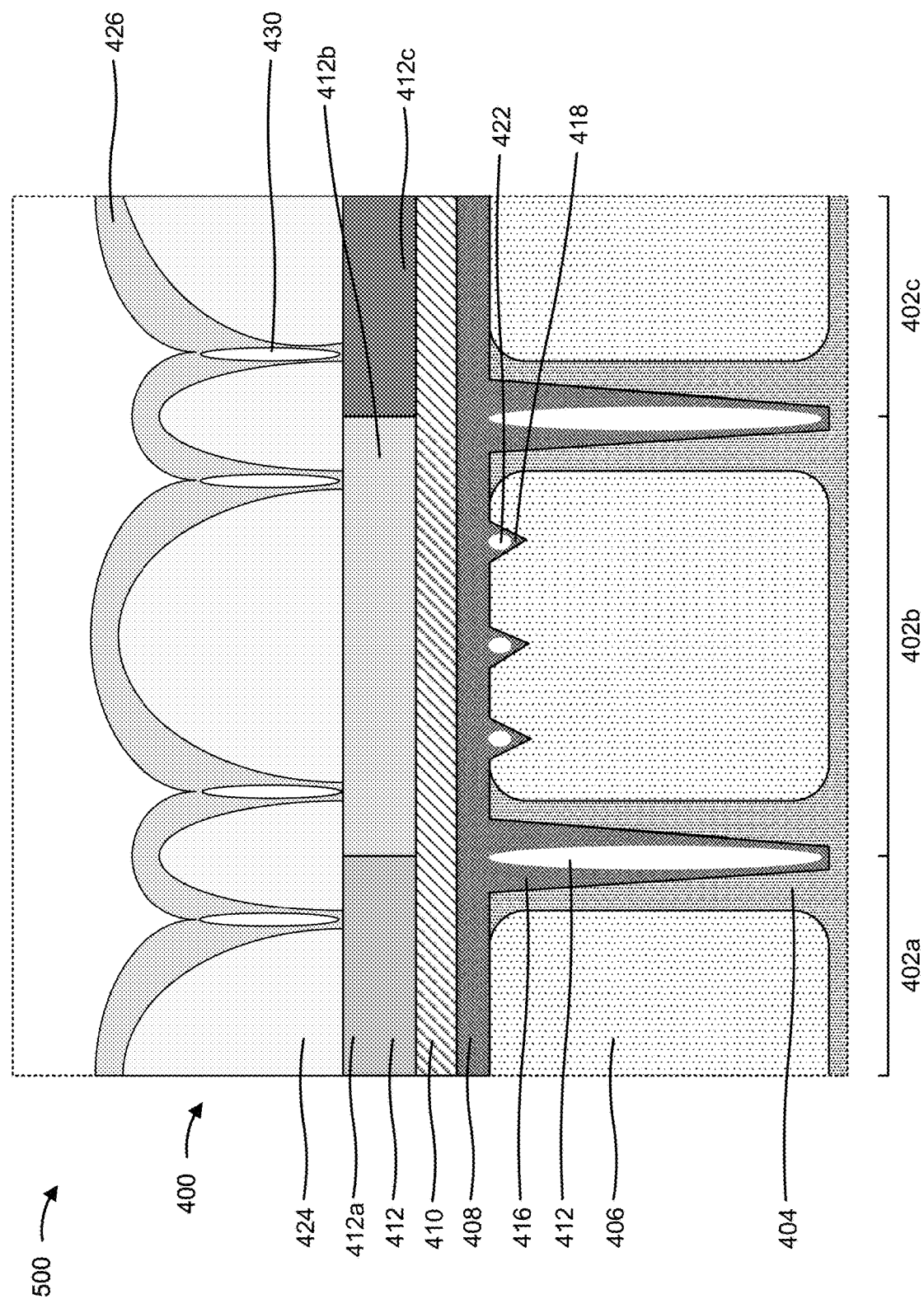

As shown in FIG. 5C, the dielectric film 426 may be formed over and/or on the micro-lens structures 424 and in the tapered trenches between the micro-lens structures 424. For example, a semiconductor processing tool (e.g., the deposition tool 102) may deposit the dielectric film 426. In some implementations, the semiconductor processing tool deposits the dielectric film 426 in the tapered trenches such that the dielectric film 426 partially fills the area in the tapered trenches, which results in the formation of the air gaps 430 therein. In particular, the semiconductor processing tool may deposit the dielectric film 426 in each of the tapered trenches at a deposition rate that causes the air gaps 430 to close before the dielectric film 426 can fully fill the tapered trenches. In some implementations, a deposition rage in a range from approximately 2 angstroms per second (A/S) to approximately 300 A/S may be used. Moreover, the oxide material may be deposited using various CVD techniques and/or atomic layer deposition (ALD) techniques, such as PECVD, HDP-CVD, SACVD, or PEALD.

Figure 5D:
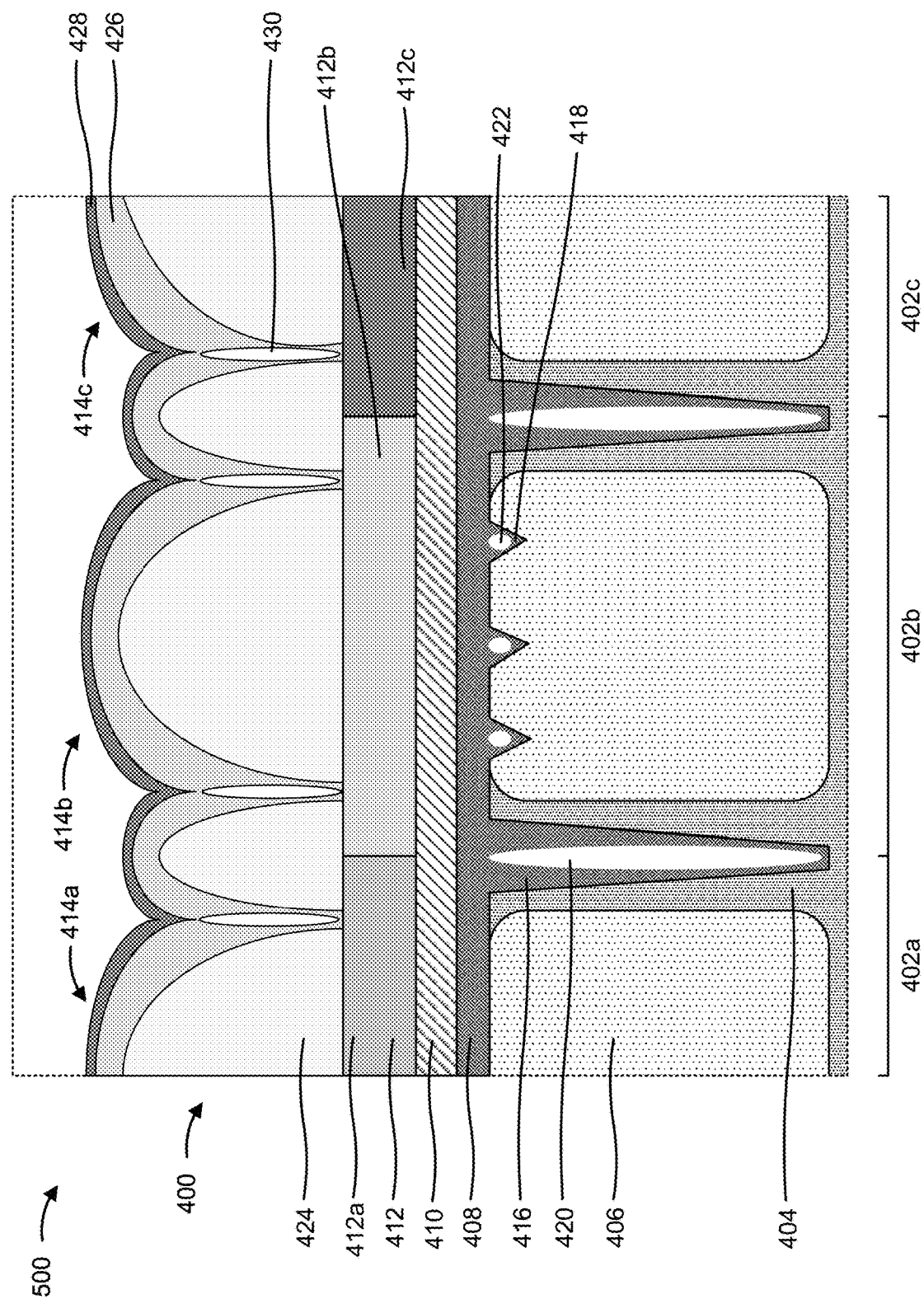

As shown in FIG. 5D, the passivation film 428 may be formed over and/or on the dielectric film 426. For example, a semiconductor processing tool (e.g., the deposition tool 102) may deposit the passivation film 428 over and/or on the dielectric film 426 using a suitable deposition technique, such a CVD technique, a PVD technique, an ALD technique, and/or another deposition technique.

As indicated above, FIGS. 5A-5D are provided as an example. Other examples may differ from what is described with regard to FIGS. 5A-5D.

Figure 6:
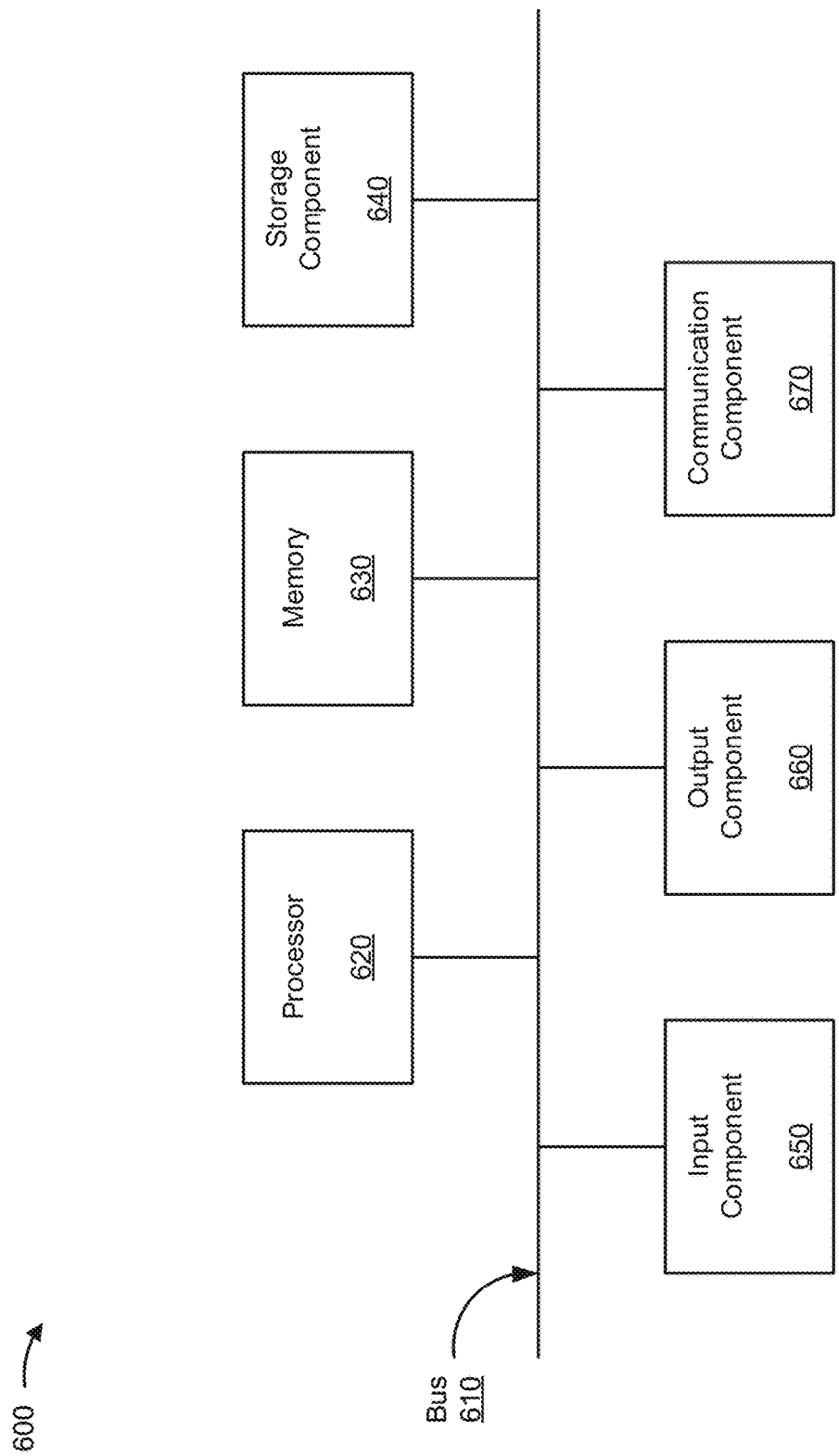
FIG. 6 is a diagram of example components of one or more devices of FIG. 1.

FIG. 6 is a diagram of example components of a device 600. In some implementations, one or more of the semiconductor processing tools 102-112 and/or the wafer/die transport tool 114 may include one or more devices 600 and/or one or more components of device 600. As shown in FIG. 6, device 600 may include a bus 610, a processor 620, a memory 630, a storage component 640, an input component 650, an output component 660, and a communication component 670.

Bus 610 includes a component that enables wired and/or wireless communication among the components of device 600. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform a function. Memory 630 includes a random access memory, a read only memory, and/or another type of memory (e.g., a flash memory, a magnetic memory, and/or an optical memory).

Storage component 640 stores information and/or software related to the operation of device 600. For example, storage component 640 may include a hard disk drive, a magnetic disk drive, an optical disk drive, a solid state disk drive, a compact disc, a digital versatile disc, and/or another type of non-transitory computer-readable medium. Input component 650 enables device 600 to receive input, such as user input and/or sensed inputs. For example, input component 650 may include a touch screen, a keyboard, a keypad, a mouse, a button, a microphone, a switch, a sensor, a global positioning system component, an accelerometer, a gyroscope, an actuator, and/or the like. Output component 660 enables device 600 to provide output, such as via a display, a speaker, and/or one or more light-emitting diodes. Communication component 670 enables device 600 to communicate with other devices, such as via a wired connection and/or a wireless connection. For example, communication component 670 may include a receiver, a transmitter, a transceiver, a modem, a network interface card, an antenna, and/or the like.

Device 600 may perform one or more processes described herein. For example, a non-transitory computer-readable medium (e.g., memory 630 and/or storage component 640) may store a set of instructions (e.g., one or more instructions, code, software code, program code, and/or the like) for execution by processor 620. Processor 620 may execute the set of instructions to perform one or more processes described herein. In some implementations, execution of the set of instructions, by one or more processors 620, causes the one or more processors 620 and/or the device 600 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

FIG. 7 is a flowchart of an example process 700 associated with forming a pixel array. In some implementations, one or more process blocks of FIG. 7 may be performed by a semiconductor processing tool (e.g., one or more of the semiconductor processing tools 102-112 described above). Additionally, or alternatively, one or more process blocks of FIG. 7 may be performed by one or more components of device 600, such as processor 620, memory 630, storage component 640, input component 650, output component 660, and/or communication component 670.

As shown in FIG. 7, process 700 may include forming a photodiode in a substrate of a pixel region of a pixel array (block 710). For example, a semiconductor processing tool (e.g., the ion implantation tool 112) may form the photodiode 206 in the substrate 204 of a pixel region 202 of the pixel array 200, as described above. As another example, a semiconductor processing tool (e.g., the ion implantation tool 112) may form the photodiode 406 in the substrate 404 of a pixel region 402 of the pixel array 400, as described above.

As further shown in FIG. 7, process 700 may include forming a first DTI structure at a first side of the photodiode (block 720). For example, a semiconductor processing tool (e.g., the deposition tool 102, the exposure tool 104, the developer tool 106, the etching tool 108, and/or another semiconductor processing tool) may form a first DTI structure 216 at a first side of the photodiode 206, as described above. As another example, a semiconductor processing tool (e.g., the deposition tool 102, the exposure tool 104, the developer tool 106, the etching tool 108, and/or another semiconductor processing tool) may form a first DTI structure 416 at a first side of the photodiode 406, as described above.

As further shown in FIG. 7, process 700 may include forming a second DTI structure at a second, opposing, side of the photodiode (block 730). For example, a semiconductor processing tool (e.g., the deposition tool 102, the exposure tool 104, the developer tool 106, the etching tool 108, and/or another semiconductor processing tool) may form a second DTI structure 216 at a second, opposing, side of the photodiode 206, as described above. As another example, a semiconductor processing tool (e.g., the deposition tool 102, the exposure tool 104, the developer tool 106, the tool etching 108, and/or another semiconductor processing tool) may form a second DTI structure 416 at a second, opposing, side of the photodiode 406, as described above.

As further shown in FIG. 7, process 700 may include depositing an oxide material in the first DTI structure such that a first air gap is formed in at least 75% of an area of the first DTI structure (block 740). For example, a semiconductor processing tool (e.g., the deposition tool 102) may deposit an oxide material in the first DTI structure 216 such that a first air gap 220 is formed in at least 75% of an area of the first DTI structure 216, as described above. As another example, a semiconductor processing tool (e.g., the deposition tool 102) may deposit an oxide material in the first DTI structure 416 such that a first air gap 420 is formed in at least 75% of an area of the first DTI structure 416, as described above.

As further shown in FIG. 7, process 700 may include depositing the oxide material in the second DTI structure such that a second air gap (220) is formed in at least 75% of an area of the second DTI structure (block 750). For example, a semiconductor processing tool (e.g., the deposition tool 102) may deposit an oxide material in the second DTI structure 216 such that a second air gap 220 is formed in at least 75% of an area of the second DTI structure 216, as described above. As another example, a semiconductor processing tool (e.g., the deposition tool 102) may deposit an oxide material in the second DTI structure 416 such that a second air gap 420 is formed in at least 75% of an area of the second DTI structure 416, as described above.

Process 700 may include additional implementations, such as any single implementation or any combination of implementations described below and/or in connection with one or more other processes described elsewhere herein.

In a first implementation, depositing the oxide material in the first DTI structure comprises depositing the oxide material in the first DTI structure by at least one of a PECVD process, an HDP-CVD process, an SACVD process, or a PEALD process. In a second implementation, alone or in combination with the first implementation, process 700 includes forming a plurality of high absorption regions (e.g., high absorption regions 218, high absorption regions 418) above the photodiode, and depositing the oxide material in the plurality of high absorption regions such that a respective third air gap (e.g., air gap 222, air gap 422) is formed in each of the plurality of high absorption regions.

In a third implementation, alone or in combination with one or more of the first and second implementations, process 700 includes forming an antireflective coating (e.g., antireflective coating 210, antireflective coating 410) above the first DTI structure, above the second DTI structure, and above the photodiode, forming a color filter layer (e.g., color filter layer 212, color filter layer 412) above the antireflective coating, and forming a micro-lens (e.g., micro-lens 214, micro-lens 414) above the color filter layer. In a fourth implementation, alone or in combination with one or more of the first through third implementations, process 700 includes depositing the oxide material on the photodiode and the substrate to form an oxide layer (e.g., oxide layer 208, oxide layer 408), and planarizing the oxide layer.

In a fifth implementation, alone or in combination with one or more of the first through fourth implementations, depositing the oxide material in the first DTI structure includes depositing the oxide material in the first DTI structure at a deposition rate to cause a top region of the first DTI structure to be filled in with the oxide material before a center region of the first DTI structure can be filled with the oxide material, thereby forming the first air gap.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

In this way, an isolation structure may be formed between adjacent and/or non-adjacent pixel regions (e.g., between diagonal or cross-road pixel regions), of an image sensor, to reduce and/or prevent optical crosstalk. The isolation structure may include a DTI structure or another type of trench that is partially filled with a material such that an air gap is formed therein. The DTI structure having the air gap formed therein may reduce optical crosstalk between pixel regions. The reduced optical crosstalk may increase spatial resolution of the image sensor, may increase overall sensitivity of the image sensor, may decrease color mixing between pixel regions of the image sensor, and/or may decrease image noise after color correction of images captured using the image sensor.

As described in greater detail above, some implementations described herein provide a pixel array. The pixel array includes a first pixel region, a second pixel region, and a DTI structure, between the first pixel region and the second pixel region, filled with an oxide material. An air gap is formed in the oxide material comprises at least 75% of an area in the DTI structure.

As described in greater detail above, some implementations described herein provide a method. The method includes forming a photodiode in a substrate of a pixel region of a pixel array. The method includes forming a first DTI structure at a first side of the photodiode. The method includes forming a second DTI structure at a second, opposing, side of the photodiode. The method includes depositing an oxide material in the first DTI structure such that a first air gap is formed in at least 75% of an area of the first DTI structure. The method includes depositing the oxide material in the second DTI structure such that a second air gap is formed in at least 75% of an area of the second DTI structure.

As described in greater detail above, some implementations described herein provide a pixel array. The pixel array includes a first pixel region. The pixel array includes a second pixel region. The pixel array includes a DTI structure between the first pixel region and the second pixel region. The pixel array includes a first micro-lens formed in the first pixel region. The pixel array includes a second micro-lens formed in the second pixel region. The pixel array includes a second air gap formed between the first micro-lens and the second micro-lens. No more than 25% of an area of the DTI structure is filled with an oxide material. At least 75% of the area of the DTI structure is filled with a first air gap formed by the oxide material in the DTI structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a photodiode in a substrate of a pixel region of a pixel array;
   forming a first deep trench isolation (DTI) structure at a first side of the photodiode;
   forming a second DTI structure at a second, opposing, side of the photodiode;
   forming a plurality of high absorption regions in the photodiode;
   depositing an oxide material in the first DTI structure such that a first air gap is formed in at least 75% of an area of the first DTI structure;
   depositing the oxide material in the second DTI structure such that a second air gap is formed in at least 75% of an area of the second DTI structure; and
   depositing the oxide material in the plurality of high absorption regions such that a respective third air gap is formed in each of the plurality of high absorption regions.

2. The method of claim 1, wherein depositing the oxide material in the first DTI structure comprises:
   depositing the oxide material in the first DTI structure by at least one of:
   a plasma-enhanced chemical vapor deposition (PECVD) process,
   a high-density plasma chemical vapor deposition (HDP-CVD) process,
   a sub-atmospheric chemical vapor deposition (SACVD) process, or
   a plasma-enhanced atomic layer deposition (PEALD) process.

3. The method of claim 1, further comprising:
   forming an antireflective coating above the first DTI structure, above the second DTI structure, and above the photodiode;
   forming a color filter layer above the antireflective coating; and
   forming a micro-lens above the color filter layer.

4. The method of claim 1, wherein depositing the oxide material in the first DTI structure, the second DTI structure, and the plurality of high absorption regions comprises:
   depositing the oxide material on the photodiode and the substrate to form an oxide layer; and
   planarizing the oxide layer.

5. The method of claim 1, wherein depositing the oxide material in the first DTI structure comprises:
   depositing the oxide material in the first DTI structure at a deposition rate to cause a top region of the first DTI structure to be filled in with the oxide material before a center region of the first DTI structure can be filled with the oxide material, thereby forming the first air gap.

6. The method of claim 1, wherein depositing the oxide material in the plurality of high absorption regions comprises:
   depositing the oxide material in the plurality of high absorption regions at a deposition rate to cause a top region of at least one high absorption region, of the plurality of high absorption regions, to be filled in with the oxide material before a center region of the at least one high absorption region can be filled with the oxide material, thereby forming the respective third air gap.

7. The method of claim 1, wherein the respective air gap is formed in at least 75% of an area of a respective high absorption region of the plurality of high absorption regions.

8. A device, comprising:
   one or more memories; and
   one or more processors, coupled to the one or more memories, configured to:
   form a photodiode in a substrate of a pixel region of a pixel array;
   form a first deep trench isolation (DTI) structure at a first side of the photodiode;
   form a second DTI structure at a second, opposing, side of the photodiode;
   form a plurality of high absorption regions in the photodiode;
   deposit an oxide material in the first DTI structure such that a first air gap is formed in at least 75% of an area of the first DTI structure;
   deposit the oxide material in the second DTI structure such that a second air gap is formed in at least 75% of an area of the second DTI structure; and
   deposit the oxide material in the plurality of high absorption regions such that a respective third air gap is formed in each of the plurality of high absorption regions.

9. The device of claim 8, wherein the one or more processors, to deposit the oxide material in the first DTI structure, are configured to:
   deposit the oxide material in the first DTI structure by at least one of:
   a plasma-enhanced chemical vapor deposition (PECVD) process,
   a high-density plasma chemical vapor deposition (HDP-CVD) process,
   a sub-atmospheric chemical vapor deposition (SACVD) process, or
   a plasma-enhanced atomic layer deposition (PEALD) process.

10. The device of claim 8, wherein the one or more processors are further configured to:
    form an antireflective coating above the first DTI structure, above the second DTI structure, and above the photodiode;
    form a color filter layer above the antireflective coating; and
    form a micro-lens above the color filter layer.

11. The device of claim 8, wherein the one or more processors, to deposit the oxide material in the first DTI structure, the second DTI structure, and the plurality of high absorption regions, are configured to:
    deposit the oxide material on the photodiode and the substrate to form an oxide layer; and
    planarize the oxide layer.

12. The device of claim 8, wherein the one or more processors, to deposit the oxide material in the first DTI structure, are configured to:
    deposit the oxide material in the first DTI structure at a deposition rate to cause a top region of the first DTI structure to be filled in with the oxide material before a center region of the first DTI structure can be filled with the oxide material, thereby forming the first air gap.

13. The device of claim 8, wherein the one or more processors, to deposit the oxide material in the plurality of high absorption regions, are configured to:
    deposit the oxide material in the plurality of high absorption regions at a deposition rate to cause a top region of at least one high absorption region, of the plurality of high absorption regions, to be filled in with the oxide material before a center region of the at least one high absorption region can be filled with the oxide material, thereby forming the respective third air gap.

14. The device of claim 8, wherein the respective air gap is formed in at least 75% of an area of a respective high absorption region of the plurality of high absorption regions.

15. A non-transitory computer-readable medium storing a set of instructions, the set of instructions comprising:
one or more instructions that, when executed by one or more processors of a device, cause the device to:
form a photodiode in a substrate of a pixel region of a pixel array;
form a first deep trench isolation (DTI) structure at a first side of the photodiode;
form a second DTI structure at a second, opposing, side of the photodiode;
form a plurality of high absorption regions in the photodiode;
deposit an oxide material in the first DTI structure such that a first air gap is formed in at least 75% of an area of the first DTI structure;
deposit the oxide material in the second DTI structure such that a second air gap is formed in at least 75% of an area of the second DTI structure; and
deposit the oxide material in the plurality of high absorption regions such that a respective third air gap is formed in each of the plurality of high absorption regions.

16. The non-transitory computer-readable medium of claim 15, wherein the one or more instructions, that cause the device to deposit the oxide material in the first DTI structure, cause the device to:
deposit the oxide material in the first DTI structure by at least one of:
a plasma-enhanced chemical vapor deposition (PECVD) process,
a high-density plasma chemical vapor deposition (HDP-CVD) process,
a sub-atmospheric chemical vapor deposition (SACVD) process, or
a plasma-enhanced atomic layer deposition (PEALD) process.

17. The non-transitory computer-readable medium of claim 15, wherein the one or more instructions further cause the device to:
form an antireflective coating above the first DTI structure, above the second DTI structure, and above the photodiode;
form a color filter layer above the antireflective coating; and
form a micro-lens above the color filter layer.

18. The non-transitory computer-readable medium of claim 15, wherein the one or more instructions, that cause the device to deposit the oxide material in the first DTI structure, the second DTI structure, and the plurality of high absorption regions, cause the device to:
deposit the oxide material on the photodiode and the substrate to form an oxide layer; and
planarize the oxide layer.

19. The non-transitory computer-readable medium of claim 15, wherein the one or more instructions, that cause the device to deposit the oxide material in the first DTI structure, cause the device to:
deposit the oxide material in the first DTI structure at a deposition rate to cause a top region of the first DTI structure to be filled in with the oxide material before a center region of the first DTI structure can be filled with the oxide material, thereby forming the first air gap.

20. The non-transitory computer-readable medium of claim 15, wherein the one or more instructions, that cause the device to deposit the oxide material in the plurality of high absorption regions, cause the device to:
deposit the oxide material in the plurality of high absorption regions at a deposition rate to cause a top region of at least one high absorption region, of the plurality of high absorption regions, to be filled in with the oxide material before a center region of the at least one high absorption region can be filled with the oxide material, thereby forming the respective third air gap.

* * * * *